United States Patent [19]

Ishikawa et al.

[11] Patent Number: 5,970,097
[45] Date of Patent: Oct. 19, 1999

[54] ARITHMETIC APPARATUS FOR USE IN VITERBI DECODING

[75] Inventors: Toshihiro Ishikawa, Sagamihara; Hidetoshi Suzuki, Yokohama, both of Japan

[73] Assignee: Matsushita Electric Industrial Co., Ltd., Osaka, Japan

[21] Appl. No.: 08/949,866

[22] Filed: Oct. 14, 1997

[30] Foreign Application Priority Data

Oct. 15, 1996 [JP] Japan ..................................... 8-291202

[51] Int. Cl.⁶ .................................................. H03M 13/12
[52] U.S. Cl. .......................... 375/262; 375/341; 714/795; 714/796
[58] Field of Search ..................... 375/262, 341; 714/795, 796

[56] References Cited

U.S. PATENT DOCUMENTS 5,802,115  9/1998  Meyer ...................................... 375/341

FOREIGN PATENT DOCUMENTS 590597  4/1994  European Pat. Off. .

*Primary Examiner*—Amanda T. Le
*Attorney, Agent, or Firm*—Pearne, Gordon, McCoy & Granger LLP

[57] ABSTRACT

An arithmetic apparatus comprising a memory 1 for storing path select signals, a barrel shifter 3 for shifting data read from the memory, a shift register 4 for receiving a bit shifted to a MSB by the barrel shifter and means 5 for generating the number of shifts which are performed by the barrel shifter by converting data positioned at a specific bit position in the shift register, wherein path select signals at the same time are divided into a plurality of groups, and then stored in the memory, and the arithmetic apparatus includes address generating means 10 for outputting the address, and address conversion means 7 for generating the address of the group which must be read by combining the address and a value of a specific bit position in the shift register with each other. Thus, tracing back in Viterbi decoding can be performed with a short bit width.

15 Claims, 15 Drawing Sheets

WHEN CONSTRAINT LENGTH K=6

WHEN CONSTRAINT LENGTH K=7

FIG.4

OPERATION OF BARREL SHIFTER 3

| CONTROL SIGNAL | OPERATION |
|---|---|
| 00000 | AS IT IS OUTPUT INPUT DATA |
| 00001 | LEFT WARD SHIFT BY 1BIT |
| 00010 | LEFT WARD SHIFT BY 2BITS |
| 00011 | LEFT WARD SHIFT BY 3BITS |
| 00100 | LEFT WARD SHIFT BY 4BITS |
| 00101 | LEFT WARD SHIFT BY 5BITS |
| 00110 | LEFT WARD SHIFT BY 6BITS |
| 00111 | LEFT WARD SHIFT BY 7BITS |
| 01000 | LEFT WARD SHIFT BY 8BITS |
| 01001 | LEFT WARD SHIFT BY 9BITS |
| 01010 | LEFT WARD SHIFT BY 10BITS |
| 01011 | LEFT WARD SHIFT BY 11BITS |
| 01100 | LEFT WARD SHIFT BY 12BITS |
| 01101 | LEFT WARD SHIFT BY 13BITS |
| 01110 | LEFT WARD SHIFT BY 14BITS |
| 01111 | LEFT WARD SHIFT BY 15BITS |
| 10000 | RIGHT WARD SHIFT BY 16BITS |
| 10001 | RIGHT WARD SHIFT BY 15BITS |
| 10010 | RIGHT WARD SHIFT BY 14BITS |
| 10011 | RIGHT WARD SHIFT BY 13BITS |
| 10100 | RIGHT WARD SHIFT BY 12BITS |
| 10101 | RIGHT WARD SHIFT BY 11BITS |
| 10110 | RIGHT WARD SHIFT BY 10BITS |
| 10111 | RIGHT WARD SHIFT BY 9BITS |
| 11000 | RIGHT WARD SHIFT BY 8BITS |
| 11001 | RIGHT WARD SHIFT BY 7BITS |
| 11010 | RIGHT WARD SHIFT BY 6BITS |
| 11011 | RIGHT WARD SHIFT BY 5BITS |
| 11100 | RIGHT WARD SHIFT BY 4BITS |
| 11101 | RIGHT WARD SHIFT BY 3BITS |
| 11110 | RIGHT WARD SHIFT BY 2BITS |
| 11111 | RIGHT WARD SHIFT BY 1BIT |

WHEN CONSTRAINT LENGTH K=6

WHEN CONSTRAINT LENGTH K=7

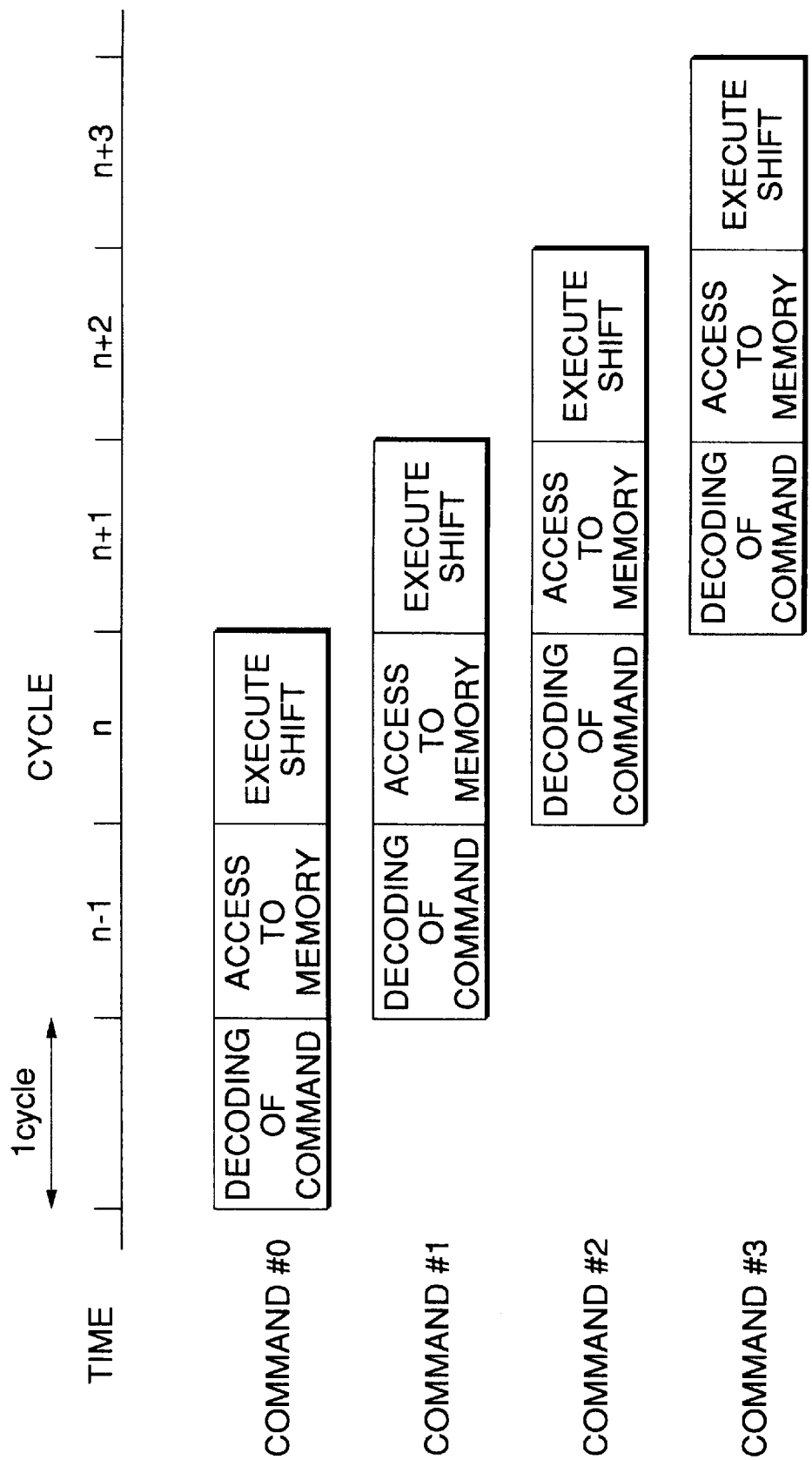

ACS CALCULATING PORTION

ARITHMETIC APPARATUS FOR USE IN VITERBI DECODING

BACKGROUND OF THE INVENTION

The present invention relates to an arithmetic apparatus which is incorporated in a mobile communication apparatus, and a digital signal processor and a radio station apparatus such as a mobile radio station and a base radio station in that the arithmetic apparatus is incorporated. More particularly, the invention relates to a structure which is capable of efficiently performing a Viterbi decoding process.

In recent years, digital signal processors (hereinafter called "DSP") have been widely used as processors of a type arranged to be built in a device, such as a portable telephone, in the movement of digitization in the mobile communication field. Since bit errors are frequently generated in data communication through a mobile radio communication line, an error correction process must be performed. As a method of correcting an error, a method may be employed in which a convolutional code generated from an input bit is decoded by the receiver side by Viterbi decoding. The error correction process is performed by using the DSP.

Viterbi decoding is performed by repeating simple processes, such as addition, comparison and selection and by performing a trace back operation for finally decoding data so that maximum likelihood decoding of a convolutional code is realized. The Viterbi decoding process will briefly be described.

The convolutional code is generated by mod2 addition of an input bit and a predetermined number of bits previous to the input bit to each other so that a plurality of coded data items are generated to correspond to one input bit. The number of input information bits affecting the coded data is called a "constraint length K", the number of which is the same as the shift registers for use to perform the mod2 addition.

Coded data is determined by the states of the input bit and the preceding (K−1) input bits. The foregoing state is shifted (transition is made) to a new state when a new information bit is supplied. The state, in which the transition is permitted, is determined whether the new input bit is 0 or 1. The number of the states is $2^{K-1}$ because each of (K−1) bits can be made to be 1 or 0.

Viterbi decoding is arranged such that a received coded data series is observed and the most probable state is estimated from all of the state transitions which are able to take place. Whenever coded data (a received data series) corresponding to one information bit is obtained, the signal distance (metric) from the path to each state at this time is therefore calculated. Operations are sequentially repeated in each of which a path having smaller metric of the paths is left as a survival path.

FIG. 17 shows a state in a convolution coder having constraint length K in which two paths each indicating a state transition extends, to a certain state S[2n] (n is a positive integer) at a certain moment, from states S[n] previous to the state S[2n] by one state and S[n+$2^{K-2}$]. An example case where K=3 will now be described. When n=1, transitions from S[1], that is, state S01, and S[3], that is, state S11, can be performed to S[2], that is, state S10 (a state where two preceding bits have been sequentially been input in the order as "1" and "0") are permitted. In a case where n=2, transitions from S[2], that is, state S10, and S[4], that is, state S00, to S[4], that is, state S00 (a state expressed by two lower bits) are permitted.

Path metric a is the sum of inter-signal distance (branch metric x) from an output symbol of a path input to state S[2n] and a received data series and path metric A which is the total sum of the branch metrics of survival paths to state S[n] previous to state S[2n].

Similarly, path metric b is the sum of inter-signal distance (branch metric y) from an output symbol of a path input to state S[2n] and a received data series and path metric B which is the total sum of the branch metrics of survival paths to state S[n+$2^{K-2}$] previous to state S[2n].

The thus-obtained path metrics a and b which are input to state S[2n] are subjected to a comparison to select smaller path metric as a survival path.

Viterbi decoding is structured such that each of the additions for obtaining the path metric, comparisons of the path metrics and selections of the path metric is performer for $2^{K-1}$ states at each time.

Moreover, a history of results of selections of the paths must be stored as path select signal PS[i], [i=0 to $2_{K-1}$]. If the suffix (for example, n) of the state previous to the selected path is smaller than suffixes (n+$2^{K-2}$) of the state previous to the non-selected path, PS[i]=0. If the foregoing suffix is larger, PS[i]=1. Since n<(n+$2^{K-2}$) in the case shown in FIG. 17, state S[n+$2^{K-2}$] is selected if a≧b so that PS[S2n]=1. If a<b, then state S[n] is selected so that PS[S2n]=0.

When decoding is finally performed by tracing back, data is decoded while tracing back the survival paths on the basis of the path select signals.

Referring to FIG. 18, the tracing back process will briefly be described. FIG. 18 shows a state of tracing back the path from state S[2n] (n is a positive integer) to state S[n] at a previous time or state S[n+$2^{K-2}$] in accordance with path select signal PS[2n].

In general, in use of state S[i] and path select signal PS[i], a previous state is expressed as S[i/2+PS[i]×$2^{K-2}$]. If convolutional code terminated at a tail bit thereof is used, the path select signal is made to be 0 when coded data at the previous time is 0. The path select signal is made to be 1 when coded data at the previous time is 1. Therefore the foregoing path select signal can be used as coded data.

The conventional arithmetic unit in the DSP for performing Viterbi decoding, as shown in FIG. 15, comprise a data memory 1 for storing path metrics, path select signal and coded data; a barrel shifter 3 for shifting data read from the data memory 1; a first bus 2 connected to the data memory 1 to supply data and transfer a result of a calculation; a first register 23 for storing the number of bits which are shifted by the barrel shifter 3; an arithmetic logical circuit (hereinafter called as an "ALU") 26 for executing a arithmetic logic operations; a first latch 24 for temporarily storing the value of the left-hand input of the ALU 26; a second latch 25 for temporarily storing the value of the right-hand input of the ALU 26; second registers 27 and 28 for temporarily storing a result of the calculation; and a second bus 12 for supplying data from the register 27 or the register 28.

The number of bits which are shifted by the barrel shifter 3 is expressed by two's complementary system. When the value is a positive number, right shift is performed. When the value is a negative number, left shift is performed.

A tracing back operation, which is performed when Viterbi decoding of coded data obtained by convolutional coding, which is terminated at a tail bit, is performed by the above-mentioned arithmetic unit, will now be described.

The conditions at this time are assumed such that the constraint length of the convolutional code is K, the number of coded information bit is n and the bit width in each of the data memory 1, the first bus 2, the second bus 12, the first latch 24, the second latch 25, the ALU 26 and the second registers 27 and 28 is $2^{K-1}$ bits.

Path select signal PSt[i] (t=0 to $\{(n-1)+(K-1)\}$, i=0 to $\{2^{K-1}\}$) at time t is stuffed into one word as pass memory PM[t]=$\{PSt[2^{K-1}-1], PSt[2^{K-1}-2], \ldots, PSt[1], PSt[0]\}$ so as to be formed into PM[t], (t=0 to $\{(n-1)+(K-1)\}$) and stored in the data memory 1.

Decoded data Y[i] (i=0 to $\{n-1\}$) is stored in the date memory 1 in such a way that one bit is made to be one word.

The tracing back operation is performed in such a way that PM[t] is read from the data memory 1; a selected path select signal is shifted to the least significant bit (LSB) by the barrel shifter 3; and then the LSB is extracted and made to be decoded data. The number of shifts is obtained with the complement of 2 of the selected state. Since the foregoing convolutional code is structured to be terminated at the tail bit, the operation starts at state 0. The previous state is obtained by calculating $[i/2+PS[i]\times 2^{K-2}]$. In accordance with the obtained state, the number of shifts required when a next path select signal is shifted to the LSB is obtained. The foregoing procedure is repeated so that a decoded code series is obtained.

The steps of the tracing back operation will now be described.

Step 1: To start the operation at state 0, fixed value "0" is stored in the second latch 25. The ALU 26, as it is, stores the value in the second latch 25 into the second register 27.

From next step 2 to step 10, the operations are repeated n times while decreasing the value of i from $\{(n-1)+(K-1)\}$ to (K-1).

Step 2: The value in the second register 27 is, through the second bus 12, stored in the first latch 24. The ALU 26 obtains the two's complement of the value in the first latch 24 to store the obtained value in the second register 28.

Step 3: The value in the second register 28 is, through the first bus 2, stored in the first register 23. Thus, the value is the number of shift bits for selecting a next path select signal.

Step 4: The path memory PM[i] is read from the data memory 1, and then shifted by the barrel shifter 3 by the number of shift bits instructed by the first register 23. Then, the value is stored in the second latch 25. The ALU 26, as it is, stores the value in the second latch 25 in the second register 28. Thus, the selected path select signal is approached to the least significant bit [LSB].

Step 5: The value in the second register 28 is, through the second bus 12, stored in the first latch 24, and then fixed value "1" is stored in the second latch 25. The ALU 26 obtains the logical product of the first latch 24 and the second latch 25 to store a result in the second register 28 (only the LSB is extracted).

Step 6: The value in the second register 28 is, as decoded data Y[i-(k-1)], stored in the data memory 1 (the LSB is made to be decoded data).

Step 7: Fixed value "K" is stored in the first register 23.

Step 8: The value in the second register 27 is, through the second bus 12, stored in the first latch 24. Then, the value in the second register 28, is through the first bus 2 output to the barrel shifter 3. The barrel shifter 3 shifts the supplied value by the number of shift bits instructed by the first register 23 to store the output therefrom in the second latch 25. The ALU 26 obtains the logical sum of the first latch 24 and the second latch 25 to store a result in the second register 28.

Step 9: Fixed value "-1" is stored in the first register 23.

Step 10: The barrel shifter 3 shifts the value in the second register 28 by the number of shift bits instructed by the first register 23 so that an output is obtained which is stored in the second latch 25. The ALU 26, as it is, stores the value in the second latch 25 in the second register 27 (steps 7 to 10 enable a previous state to be calculated).

As described above, the conventional arithmetic unit is structured to perform the calculation by combining the barrel shifter 3 and the ALU 26 so that the tracing back operation for Viterbi decoding n-bit information bits is completed in (9n+1) steps.

However, the above-mentioned conventional arithmetic unit suffers from a problem in that a great number of execution steps must be performed to complete the tracing back operation. A arithmetic unit, which is capable of overcoming the foregoing problem, has been disclosed in, for example Unexamined Japanese Patent Publication 6-112848.

The foregoing arithmetic unit, as shown in FIG. 16, comprises: a data memory 1 for storing path metrics, path select signals and the like; a bus 2 connected to the data memory 1 and arranged to supply data and to transfer a result of the calculation; a barrel shifter 3 for shifting a selected path select signal of path memory data read from the data memory 1 to the most significant bit (MSB); a shift register 4 for shift-receiving the MSB of the output from the barrel shifter 3 and load data from the data memory 1 through the bus 2 or storing data into the data memory 1; and an invertor 29 for inverting the values of a predetermined plural bit positions in the shift register 4 to supply the same as the number of shift bits to the barrel shifter 3.

The number of bits which are shifted by the barrel shifter 3 is expressed by a two's complementary system. When the value is a positive number, the right shift is performed. When the value is a negative number, left shift is performed. The shift register 4 is structured such that its shift input side is the MSB.

A tracing back operation, which is performed when Viterbi decoding of coded data obtained by convolutional coding, which is terminated at a tail bit, is performed by the above-mentioned arithmetic unit, will now be described.

The conditions at this time are assumed such that the constraint length of the convolutional code is K, the number of coded information bit is n and the bit width in each of the data memory 1, the bus 2 and shift register 4 is $2^{K-1}$ bits. The MSB, which is the output from the barrel shifter 3 is supplied to the shift input of the shift register 4. The second register 28 inverts (K-1) upper bits in the shift register 4, and then outputs K bits, which is the sum obtained by adding "0" to the MSB of (K-1) bits output from the shift register 4, as the number of shift bits.

Similarly to the above-mentioned unit, path select signal PSt[i] (t=0 to $\{(n-1)+(K-1)\}$, i=0 to $\{2^{K-1}-1\}$) is stuffed into one word as pass memory PM[t]=$\{PSt[2^{K-1}-1], PSt[2^{K-1}-2], \ldots, PSt[1], PSt[0]\}$ so as to be formed into PM[t], (t=0 to $\{(n-1)+(K-1)\}$) and stored in the data memory 1. Decoded data Y[i] (i=0 to $\{n-1\}$) is stored in the data memory 1 in such a way that one bit is made to be one word.

The tracing back operation is performed in such a way that the path memory read from the data memory 1 is shifted by the barrel shifter 3 so that the path select signal, which must be selected, is shifted to the MSB. Then, the shifted path select signal is supplied to the shift register 4. At this time, (K-1) upper bits in the shift register 4 indicate a previous state. Therefore, a next number of shifts can be obtained by inverting the (K–1) upper bits. The foregoing number of shifts is generated by the invertor 29. Then, a path select signal, which must be selected in a next path memory, is shifted to the MSB of the output from the barrel shifter 3 to supply the shifted path select signal to the shift register 4.

The foregoing operation is repeated so that the selected path select signals, which serve as decoded data, are sequentially stored in the shift register 4. Whenever a predetermined number of bits has been stored, they are stored in the data memory 1.

The steps of the tracing back operation will now be described.

Step 1: To start the operation at state 0, data of fixed value "0" is loaded to be stored in the shift register 4.

From next steps 2 and 3, the operations are repeated n times while decreasing the value of i from {(n–1)+(K–1)} to (K–1).

Step 2: The path memory PM[i] is read from the data memory 1, and then shifted by the barrel shifter 3 by the number of shift bits instructed with K bits, which are output from the invertor 29. Then, the MSB of the output fromn the barrel shifter 3 is shift-input to the shift register 4. Thus, the foregoing operation causes the path select signal, which must be selected, is approached to the most significant bit [MSB]. In this case, [K–1] upper bits of the shift register 4, to which the shift-input has been made, indicates the previous state. Inversion of [K–1] upper bits is the basis of the number of shift bits for selecting a next pat select signal.

Step 3: Whenever $2^{K-1}$ bits are decoded, the contents of the shift register 4 are, one time, stored in the data memory 1, Thus, the path select signal selected and stored in the shift register 4 is made to be decoded data.

As described above, the above-mentioned unit is arranged such that the selection of the path select signal and calculation of the previous state are performed in step 2. Therefore, the tracing back process in the Viterbi decoding of n-bit information bits can be completed in $\{n+(n/2^{K-1})+1\}$ steps.

However, the above-mentioned conventional arithmetic units are structured on a condition that the bit width of the data memory and the bus must be $2^{K-1}$ (K is a constraint length of the convolutional code required to be decoded) or greater. Thus, there arises a problem in that enlargement of the value of K arises a necessity of enlarging the width of the bit in the data path.

SUMMARY OF THE INVENTION

The present invention is able to overcome the above-mentioned problem and an object of the same is to provide an arithmetic apparatus which is capable of quickly and efficiently performing a tracing back process in Viterbi decoding even if the value of $2^{K-1}$ is larger than the width of the bit in the data path. Another object of the present invention is to provide a digital signal processor and a radio station apparatus in that the above-mentioned arithmetic apparatus is incorporated.

Accordingly, an arithmetic apparatus according to the present invention is structured in such a way that path select signals at the same time are divided into a plurality of groups and then stored in a data memory. Moreover, the address for reading the group is generated by combining the address output from address generating means and the value of a specific bit position in a shift register to which selected path select signals are sequentially supplied.

Therefore, the tracing back process in Viterbi decoding can be performed even if the width of the bit is shorter than $2^{K-1}$ bits. Thus, high-speed and efficient calculations can be performed.

According to the present invention, there is provided an arithmetic unit comprising: a data memory for storing path select signals; a barrel shifter for shifting data read from the data memory; a shift register for receiving one bit shifted to a MSB by the barrel shifter and data conversion means for generating the number of shifts which are performed by the barrel shifter by converting data positioned at a specific bit position in the shift register so as to perform s Viterbi decoding process for generating the number of shifts which are performed by the barrel shifter, wherein path select signal at the same time are divided into a plurality of groups and then stored in the data memory, and the arithmetic apparatus includes address generating means for outputting the address in the data memory, and address conversion means for generating the address of the group, which must be read from the data memory, in accordance with the address output from the address generating means and the value of a specific bit position in the shift register. Thus, a tracing back process in Viterbi decoding can be performed with a width of a bit shorter than $2^{K-1}$ bits.

Further, in the arithmetic apparatus, the path select signals are divided into a plurality of groups in order to cause suffix respectively provided for the path select signals to be continued in the group, and the address conversion means uses the address output from the address generating means and the values of positions of a predetermined number of bits including a bit at an input end of the shift register to generate the address of the group. In an example case where K=6, path select signals in a total quantity of 32 bits at time t are stored in the form two words each of which is composed of PSt[0] to PSt[15] and PSt[16] to PSt[31] and each of which has a width of 16 bits.

Further, in the arithmetic apparatus, the data conversion means inverts the values of the positions of a predetermined number of bits excluding a bit at an input end of the shift register to generate the number of shifts which are performed by the barrel shifter. Assuming that the bit width of each word of the path select signal, which is stored in the date memory, is n, $\log_2 n$ upper bits excluding the MSB in the shift register are inverted so that the number of shifts which are performed by the barrel shifter is generated.

Furthermore, in the arithmetic apparatus, the path select signals are divided into a plurality of groups in order to cause suffixes respectively provided for the path select signal to maintain predetermined differences in the group, and the address conversion means uses the address output from the address generating means and the values of positions of a predetermined number of bits excluding a bit at an input end of the shift register to generate the address of the group. In an example case where K=6, path select signals are divided into a group composed of path select signals PSt[0], PSt[2], . . . , PSt[30] and having even-number suffixes and a group composed of path select signals PSt[1], PSt[3], . . . , PSt[31] and having odd-number suffixes.

Furthermore, in the arithmetic apparatus, the data conversion means inverts the values of the positions of a predetermined number of bits including a bit at an input end of the shift register to generate the number of shifts which are performed by the barrel shifter. Thus, $\log_2 n$ upper bits including the MSB in the shift register are inverted so that the number of shifts which are performed by the barrel shifter is generated.

Furthermore, in the arithmetic apparatus, the address conversion means obtains, from a predetermined position of a bit in the shift register and the time at which a group previous to the group is read from the data memory, the value required to generate the address of the group and supplied from the shift register. Thus, a tracing back process having a pipeline structure can be performed.

Moreover, the arithmetic apparatus further comprises an ACS (Add, Compare and Select) processing means for performing addition, comparison and s election operations in the Viterbi decoding process, wherein path select signals output from the ACS processing means are sequentially stored in the shift register, and after the path select signal of the group has been stored in the shift register, the path select signal is in each group, shifted to be stored in the data memory. Thus, the groups of path select signals can efficiently be stored by using the tracing back processing mechanism.

Alternatively, the arithmetic apparatus further comprise ACS processing means for performing addition, comparison and selection operations in the Viterbi decoding process, wherein path select signals output from the ACS processing means are sequentially stored in a plurality of shift registers including the shift register, and after the path select signal of the group has been stored in the shift register, the path select signal is in each group, shifted to be stored in the data memory. Thus, the groups of path select signals can efficiently be stored by using the tracing back processing mechanism.

Still further, in the arithmetic apparatus, the ACS processing means has addition means composed of a plurality of full adders and transmission of carry signals output from a portion of the full adders to a next full adder is permitted so that the addition means is permitted to be used as one or more accumulators. Thus, the adders for the ACS calculations can commonly be used as general accumulators.

Furthermore, according to the present invention, it is provided a digital signal processor (DSP) in which the above-mentioned arithmetic apparatus is incorporated, so that the DSP is capable of quickly and efficiently performing a tracing back process in Viterbi decoding. Moreover, according to the invention, it is provided a radio station apparatus in that the above-mentioned arithmetic apparatus is incorporated.

BRIEF DESCRIPTION OF THE DRAWINGS

FIG. 4 is a diagram showing the operation of a barrel shifter of the arithmetic apparatus according to the embodiments of the present invention;

FIG. 8 is a timing chart showing a pipeline operation which is performed by the arithmetic apparatus according to the second embodiment;

DETAILED DESCRIPTION OF PREFERRED EMBODIMENTS

Embodiments of the present invention will now be described with reference to the drawings.

First Embodiment

Figure 1:
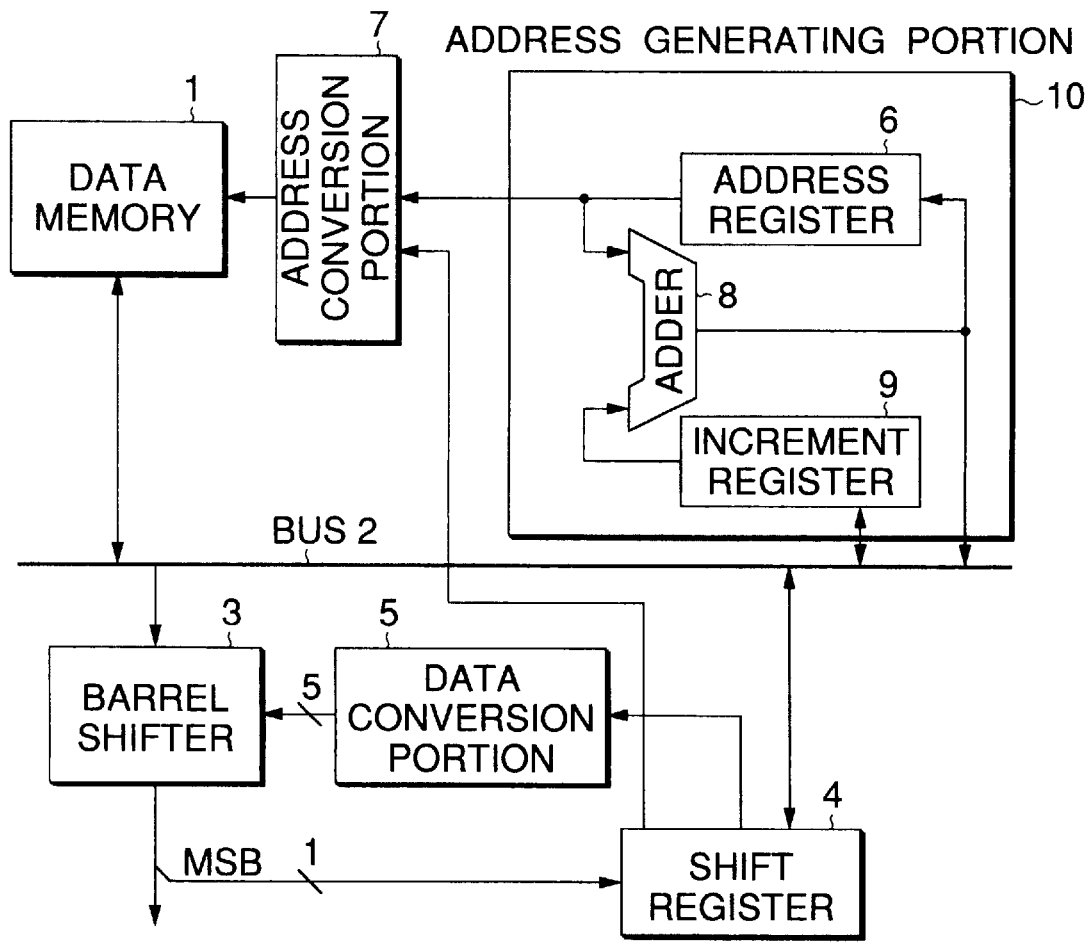
FIG. 1 is a block diagram showing the structure of an arithmetic apparatus according to a first embodiment of the present invention.

An arithmetic apparatus according to a first embodiment, as shown in FIG. 1, comprises a data memory 1 for storing path metrics, path select signals and so forth, a bus 2 connected to the data memory 1 to supply data and transfer a result of a calculation, a barrel shifter 3 for shifting data read from the data memory 1 through the bus 2, a shift register 4 for outputting the MSB to an address conversion portion 7 and loading data supplied from the data memory 1 through the bus 2 into the data memory 1, a data conversion portion 5 for inverting the value of a predetermined plural bit positions in the shift register 4 to supply the inverted values to the barrel shifter 3 as the number of shift bits, an address generating portion 10 for generating the address which is supplied to the data memory 1 and the address conversion portion 7 for converting the values supplied from the address generating portion 10 and the shift register 4 to output as the address of the data memory 1. The address generating portion 10 has an address register 6 for storing the address which is supplied to the data memory 1, an increment register 9 for storing the increased value which must be added to the address register 6 and an adder 8 for adding the value in the increment register 9 to the value in the address register 6 to store a result of the addition into the address register 6.

The number of shift bits in the barrel shifter 3 is expressed by tow's complement system. When the value is a positive number, left-hand shift is performed. When the value is a negative number, right-hand shift is performed. The shift register 4 is arranged in such a way that the shift input side is the most significant bit (MSB).

The operation of a tracing back process which is performed when Viterbi decoding of a convolutional code having a constraint length K=6 terminated at the tail bit thereof is performed will now be described with reference to FIGS. 1, 2, 3, 4 and 5. An assumption is made here that the number of coded information bit is n. Another assumption is made that the bit width n of the data path for the data path for the data memory 1, the bus 2, the barrel shifter 3, the shift register 4, the address register 6 and the like is 16 bits (m=16). Therefore, differently from that of the conventional structure, the-value of $2^{K-1}$ (=32) is larger than the bit width of the data path.

Figure 2:
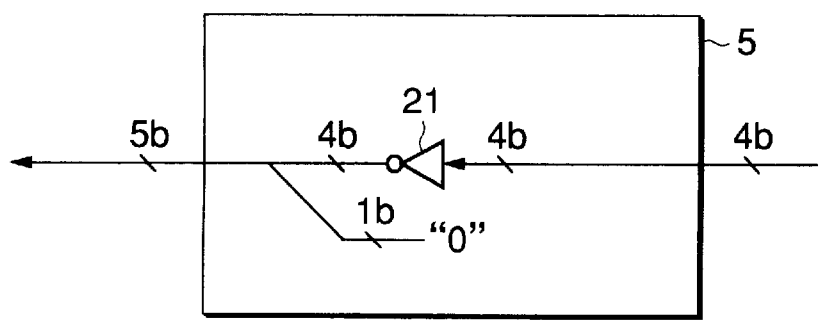
FIG. 2 is a diagram showing the structure of a data conversion portion of the arithmetic apparatus according to the first embodiment.

The data conversion portion 5, as shown in FIG. 2, comprises, an invertor 21. The data conversion portion 5 receives four bits obtained by subtracting the MSB from five upper bits in the shift register 4. Then, the invertor 21 inverts the supplied value of the four bits ($\log_2 m$). A value of five bits obtained by adding value "0" to the MSB of the four bits output from the invertor 21 is output to the barrel shifter 3 as a control signal indicating the number of shift bits.

FIG. 4 is a diagram showing the operation specification of the barrel shifter 3, the barrel shifter 3 being arranged to follow a 5-bit control signal output from the data conversion portion 5 to perform a shifting operation for shifting an input signal, as shown in FIG. 4.

Figure 5:
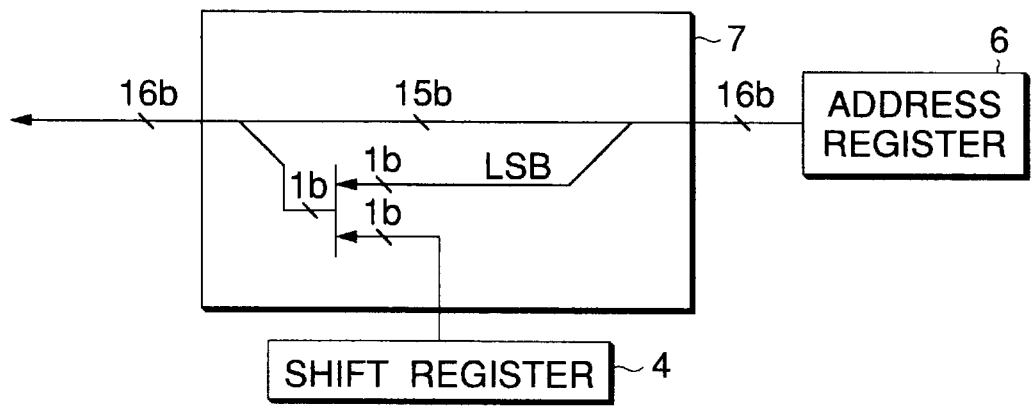
FIG. 5 is a diagram showing the structure of an address conversion portion of the arithmetic apparatus according to the first embodiment.

The address conversion portion 7 has a structure shown in FIG. 5 so as to receive 16 bits output from the address register 6 and the MSB in the shift register 4. The address conversion portion 7, as it is, outputs 15 upper bits output from the address register 6 and selects the LSB of the output from the address register 6 and the MSB in the shift register 4 to output the selected value as the LSB of the address which is supplied to the data memory 1.

Figure 3A:
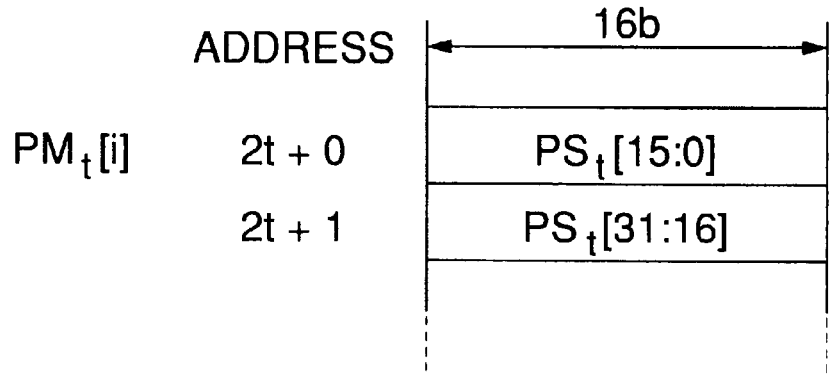
FIGS. 3A and 3B are diagrams showing the structure of data stored in a data memory of the arithmetic apparatus according to the present invention.
Figure 3B:
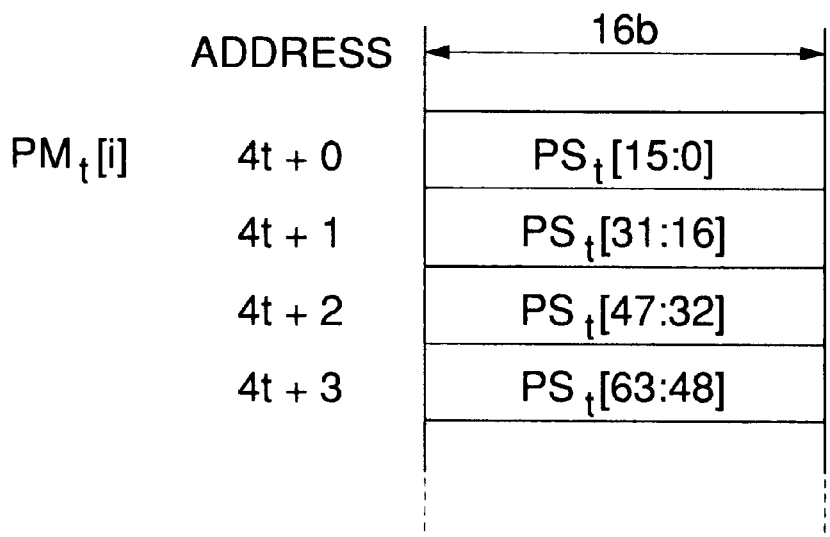

FIG. 3A and 3B show a state where path select signals have been stored in the data memory 1 having a width of 16 bits. Path select signals PSt[i] (i=0 to 31) in a quantity of 32 bits at time t are, as shown in FIG. 3A, stuffed into two words and stored in the data memory 1 having a width of 16 bits. That is, PSt[15:0] is stored in address "2t+0", while PSt[31:16] is stored in address "2t+1".

A fact to which attention must be paid is that when the value of numeral i indicating a state is expressed by a five-bit binary number and its MSB is 0 (when i=0 to 15), the corresponding PSt[i] is stored at the address "2t+0" in the data memory 1. When its MSB is 1 "(when i=16 to 31), the corresponding PSt[i] is stored at the address "2t+1" in the data memory 1. The reason why the MSB in the shift register 4 is supplied to the address conversion portion 7 according to this embodiment lies in the foregoing fact. As described later, numeral i indicating a state is stored in five upper bits in the shift register 4 during the tracing back process. The MSB in the shift register 4 supplies address information for instructing "+0" or "+1" of the address "2t".

Decoded data Y[j], (j=0 to {n−1}) is processed such that 16 bits are stuffed to one word, and then stored in the data memory 1.

The tracing back operation is performed in such a way that the address generating portion 10 outputs the value stored in the address register 6. Then, the quantity of increase realized by the increment register 9 is added to the output value so as to be again stored in the address register 6. Since the above-mentioned operation is repeated, the addresses corresponding to "2t+0" are sequentially output. When the MSB in the shift register 4 is 0, the address conversion portion 7 supplies "2t+0" to the data memory 1 as the address and supplies "2t+1" when the MSB in the shift register 4 is 1.

In accordance with the address output from the address conversion portion 7, the data memory 1 reads the path memory. The foregoing path memory is supplied to the barrel shifter 3. Then, the barrel shifter 3 shifts the selected path select signal in the read path memory to the MSB in accordance with the control signal supplied from the data conversion portion 5. The MSB is supplied to the shift register 4.

Five upper bits stored in the shift register 4 at this time indicate a previously selected state. The MSB of the five upper bits is output to the address conversion portion 7 to instruct "+0" or "+1" of a next address. Four residual bits are output to the data conversion portion 5 to be inverted. In one word of the divided two words of the path memories and stored as described above, the value of the inverted four bits indicates the required number of shifts for shifting the path select signal to the MSB corresponding to the previously selected state.

The above-mentioned procedure is repeated so that the selected path select signals, which are made to be decoded data, are sequentially stored in the shift register 4. When a predetermined number of bits of the path select signals have been stored, they are transferred to the data memory 1.

Then, the steps of the tracing back operation will now be described.

Step 1: "0" is stored in the address register 6 as an initial value.

Step 2: fixed value "2" is stored in the increment register 9.

Step 3: To start at state 0, the fixed value "0" is loaded and stored into the shift register 4.

Step 4 and step 5 are repeated n times in such a way that the value of j is decreased from {(n−1)+5} to 5.

Step 4: The address generating portion 10 outputs the value in the address register 6 to the address conversion portion 7 and causes the adder 8 to add the value in the address register 6 to the value in the increment register 9 to again store the value in the address register 6 to perform updating. The address conversion portion 7, as it is, outputs 15 upper bits of the values supplied from the address register 6 to the data memory 1. Moreover, the address conversion portion 7 selects the value of the MSB in the shift register 4 to output it as the LSB of the address which is supplied to the data memory 1. The data memory 1 reads the path memory PM[i] from the address output from the address conversion portion 7 to output it to the barrel shifter 3 through the bus 2. The barrel shifter 3 performs shifting by the number of shift bits instructed by the 5 bits output from the data conversion portion 5 so as to shift-input the MSB of the output from the barrel shifter 3 to the shift register 4 (the path select signal, which is selected, is approached to the most significant bit [MSB]. At this time, (K−1) upper bits (=5 bits) in the shift register 4 to which the shift-input has been performed indicate a previous state. Moreover, inversion of [K−1] upper bits is the base of the number of shift bits for selecting a next path select signal).

Step 5: Whenever 16 bits are decoded, the contents in the shift register 4 is, one time, stored in the data memory 1 (the path select signal selected and stored in the shift register 4 is made to be decoded data).

As described above, the arithmetic apparatus according to this embodiment is able to complete the tracing back process in Viterbi decoding of n-bit information bits in $\{n+(n/2^{K-1})+3\}$ steps. Since the address register 6 and the address conversion portion 7 supply the address corresponding to the value in the shift register 4 to the data memory 1 in step 4, the tracing back process can efficiently be performed even if the path select signals PSt[i] at time t are divided into a plurality of words in the data memory 1 as shown in FIG. 3.

Although the description has been performed about the structure in which the MSB of five upper bits in the shift register 4 is output to the address conversion portion 7 and four residual bits are output to the data conversion portion 5, another structure may be employed in which five upper bits in the shift register 4 are output to the address conversion portion 7; the address conversion portion 7 outputs the MSB of the five bits to the address conversion portion 7 and then inverts four residual bits to add 0 to the MSB.

Although the described embodiment has the structure such that the constraint length is 6, the present invention may be applied to another structure having another constraint length by performing required changes. If the constraint length K=7 for example, the path select signal PSt[i] at time t is divided into four words as shown in FIG. 3B and stored in the data memory 1. In this case, two upper bits of six upper bits in the shift register 4 are used to specify the address and four residual bits are used as the base of the number of shift bit for selecting a next path select signal.

Second Embodiment

An arithmetic apparatus according to a second embodiment has a structure suitable to perform a pipeline structure calculating process.

Figure 6:
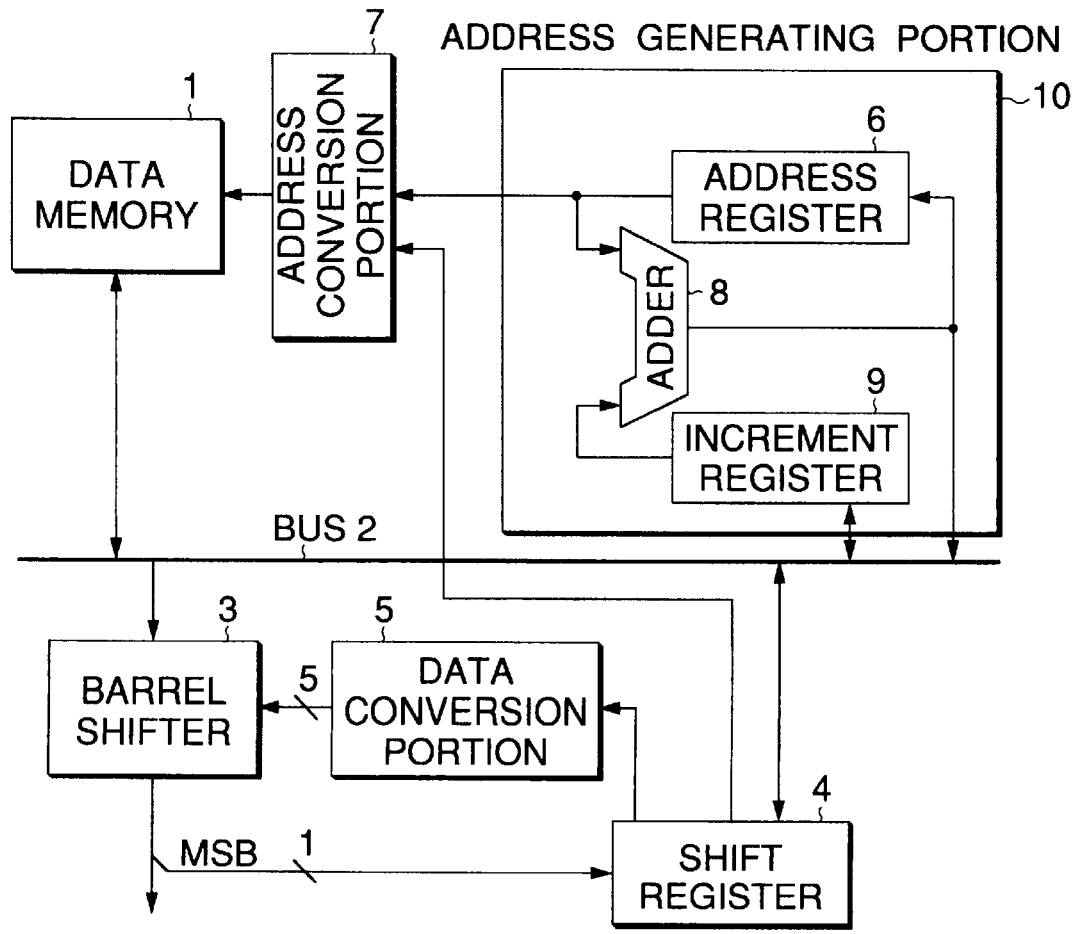
FIG. 6 is a block diagram showing the structure of an arithmetic apparatus according to a second embodiment of the present invention.

The unit according to this embodiment has a structure as shown in FIG. 6. The unit according to this embodiment is different from that according to the first embodiment (see FIG. 1) in the following three structures.

A first difference lies in the connection relationship between the data conversion portion 5 and the shift register 4. The structure is formed in such a way that four upper ($log_2m$) bits including the MSB in the shift register 4 are supplied to the data conversion portion 5 differently from the first embodiment.

A second difference lines in the connection relationship between the address conversion portion 7 and the shift register 4. This embodiment is structured such that the fourth bit counted from the MSB, that is, the value of bit 12 is supplied to the address conversion portion 7 in place of supply of the MSB of the shift register 4.

Figure 7A:
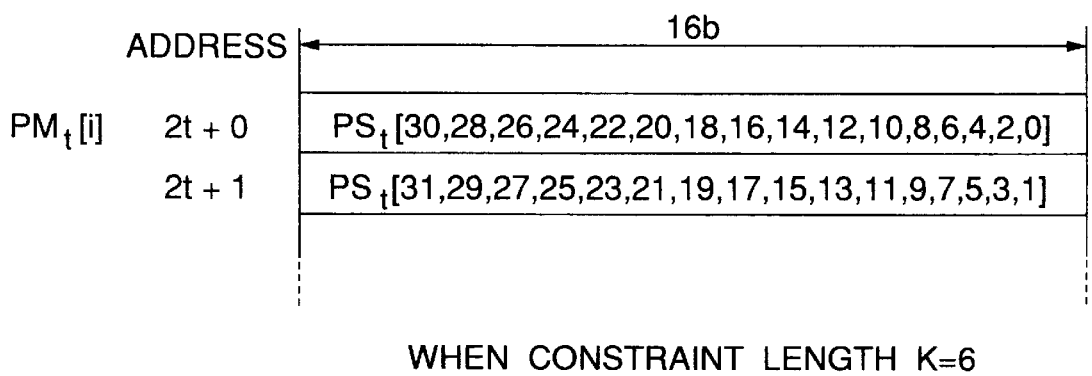
FIGS. 7A and 7B are diagrams showing the structure of data stored in a data memory of the arithmetic apparatus according to the second embodiment.

A third difference lies in the positions of bits of the path select signals stored in the data memory 1. In the data memory 1, PSt[i] (i=even numbers) of 32 bits of the path select signals PSt[i] (i=0 to 31) at time t are stored at address "2t+0" and PSt[i] (i=odd numbers) are stored at address "2t+1", as shown in FIG. 7A.

A fact to which attention must be paid is that when the value of numeral i indicating a state is expressed by a five-bit binary number and its LSB is 0 (i=an even number) in place of MSB, the corresponding PSt[i] is stored at the address "2t+0" in the data memory 1. When its LSB is 1 "(i=an odd number), the corresponding PSt[i] is stored at the address "2t+1" in the data memory 1. The reason why the MSB in the shift register 4 is not supplied to the address conversion portion 7 according to this embodiment lies in the foregoing fact.

The reason why the connection is established in such a manner that data which is the fourth bit counted from the MSB in the shift register 4 is supplied to the address conversion portion 7 in place of supply of fifth bit data lies in the following fact.

The arithmetic apparatus according to this embodiment, as shown in FIG. 8, performs a pipeline structure operation. To perform shift at cycle n+1 to follow command #1 for example, an address must previously be supplied to the data memory 1 at the leading end of the cycle n to make an access to the memory. Since the LSB of the address in the data memory 1 to which data which must be shifted at cycle n+1 is a value which is shifted in at the fifth bit counted from the MSB in the shift register 4 at the time the cycle n has been performed, it is, at the leading end of the cycle n, positioned at the fourth bit counted from the MSB. Therefore, the fourth bit counted from the MSB in the shift register 4 is, in place of the fifth bit, connected to the address conversion portion 7.

Five upper bits stored in the shift register 4 indicate a previously selected state. A value obtained by inverting four upper bits of the five upper bits, in one word in the path memory stored such that the path select signals are divided into an even-number group and an odd-number group and then stored, indicates the number of shifts required to shift the path select signal corresponding to the previously selected path select signal to MSB.

Decoded data Y[j], (j=0 to $\{n-1\}$) is processed such that 16 bits are stuffed to one word, and then stored in the data memory 1.

The unit according to this embodiment having the above-mentioned structure is able to perform the tracing back process with processing steps similar to those according to the first embodiment when a pipeline structure calculation operation as shown in FIG. 8 is performed.

The steps of the tracing back operation will now be described.

Step 1: "0" is stored in the address register 6 as an initial value.

Step 2: Fixed value "2" is stored in the increment register 9.

Step 3: to start at state 0, fixed value "0" is stored in the shift register 4.

Next step 4 and step 5 are repeated n times while decreasing the value of adjacent from $\{(n-1)+5\}$ to 5.

Step 4: The address generating portion 10 outputs the value in the address register 6 to the address conversion portion 7 and causes the adder 8 to add the value in the address register 6 to the value in the increment register 9 to again store a result in the address register 6 to update the value. The address conversion portion 7, as it is, outputs, to the data memory 1, fifteen upper bits of the value supplied from the address register 6. Moreover, the address conversion portion 7 selects the value of the fourth bit counted from the MSB in the shift register 4 to output as the LSB of the address which is supplied to the data memory 1. The data memory 1 reads path memory PM[i] from the address output from the address conversion portion 7 to store it in the internal latch (not shown).

Step 4': The data memory 1 outputs the value in the internal latch (not shown) to the barrel shifter 3 through the bus 2. The barrel shifter 3 performs shift by the number of shift bits instructed with the five bits which are the output from the data conversion portion 5 to shift-input the MSB of the output from the barrel shifter 3 to the shift register 4 (the path select signal, which must be selected, is approached to the most significant bit [MSB]. [K−1] upper bits (=5 bits) in the shift register 4, to which the shift-input has been performed, indicate a previous state. Moreover, inversion of [K−1] upper bits is the base of the number of shift bits for selecting a next path select signal).

Step 5: Whenever decoding of 16 bits is performed, the contents in the shift register 4 are, one time, stored in the data memory 1 (the path select signal selected and stored in the shift register 4 is made to be decoded data).

Since step 4 and step 4' respectively correspond to the cycle of the memory access and the cycle of the shift execution in the pipelines structure shown in FIG. 8, the foregoing processes are considered as if they are performed in one step.

Since the arithmetic apparatus according to this embodiment is structured in such a way that 32 bits of path select signal PSt[i] (i=0 to 31) are divided into an even-number group and an odd-number group and stored in the data memory 1 as described above, the word of the path memory, which must be read, can be instructed at a previous cycle time even if the calculation process is performed by the pipeline manner. Thus, the pipeline process of the tracing back can efficiently be performed by processing steps similar to those according to the first embodiment.

Figure 7B:
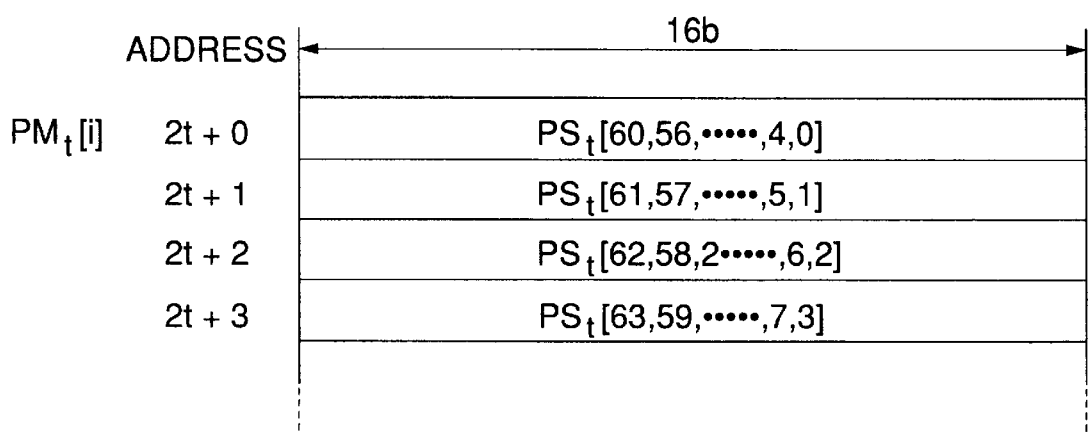
Figure 9:
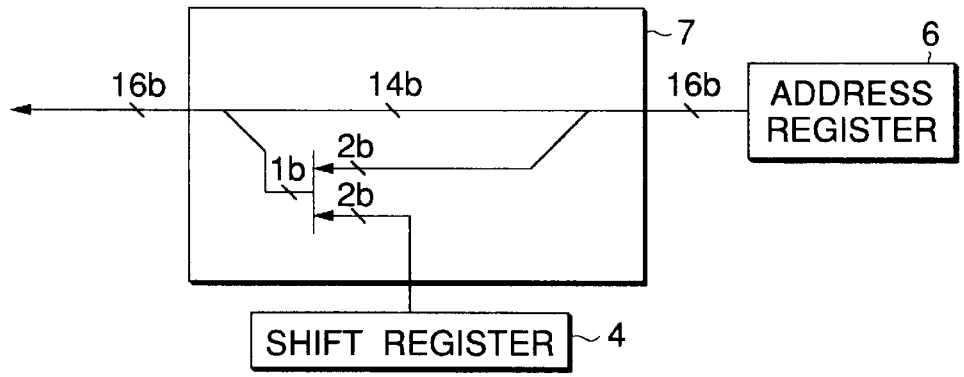
FIG. 9 is a diagram showing the structure of an address conversion portion of the arithmetic apparatus according to the second embodiment.

The design of the connection relationship between the address conversion portion 7 and the shift register 4 may be changed to be adaptable to the pipeline structure. Moreover, the positions of the bits of the path select signals which are stored in the data memory 1 may be changed in accordance with the value of the constraint length K of the convolutional code. If the constraint length is K=7 for example, the positions are required to cause two lower bits of the value of numeral i indicating the state to determine the stored address, as shown in FIG. 7B. At this time, the address conversion portion 7 may be designed in such a manner that a corresponding two-bit value in the shift register 4 is supplied to convert the address, as shown in FIG. 9.

As described above, the structure according to this embodiment may variously be designed to be adaptable to the constraint length K of the convolutional code, which must be decoded, and the pipeline operation structure of the arithmetic apparatus.

Third Embodiment

An arithmetic apparatus according to a third embodiment is able to efficiently perform an ACS (Add, Compare and Select) calculations, that is, addition, comparison and selection operations as well as the tracing back process in Viterbi decoding.

Figure 10:
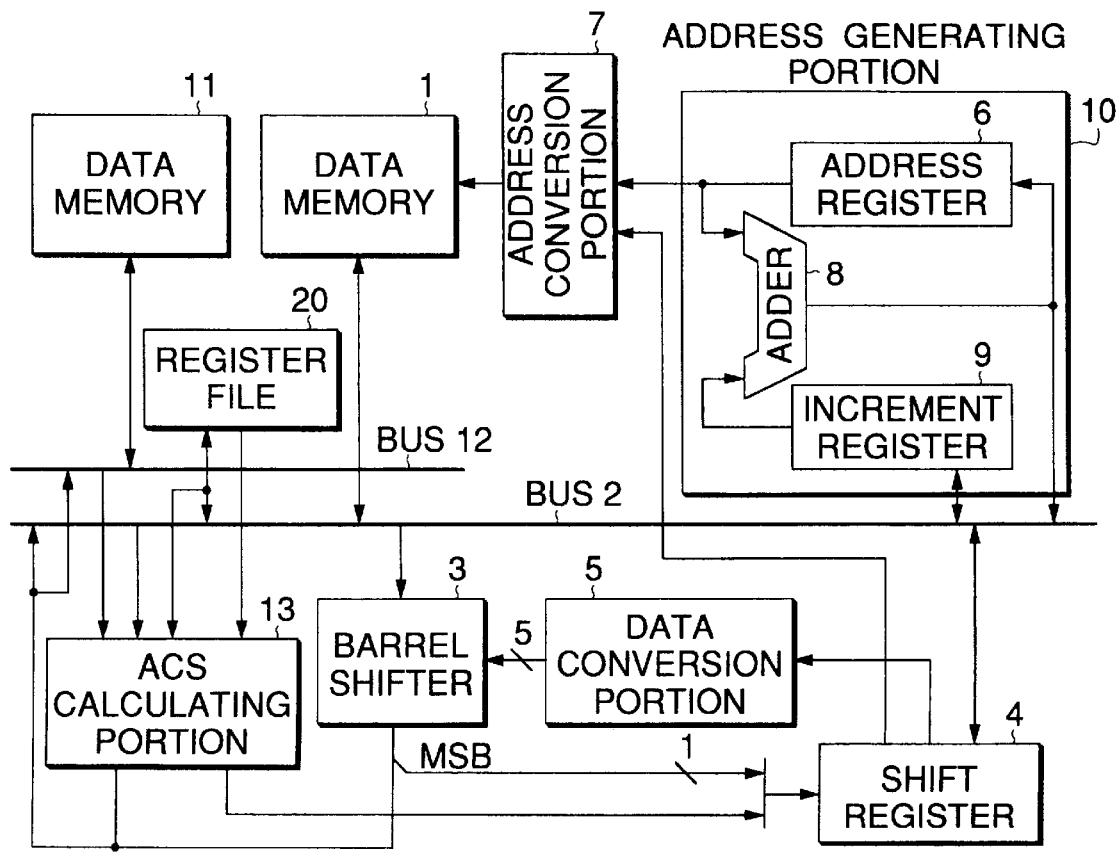
FIG. 10 is a block diagram showing the structure of an arithmetic apparatus according to a third embodiment of the present invention.

The unit according to this embodiment, as shown in FIG. 10, comprises elements 1 to 10, which are the same as those according to the first embodiment (see FIG. 1) and further comprises a data memory 11 for storing the values of path metrics for use in the Viterbi decoding process together with the data memory 1, a register file 20 for storing the values of branch metrics, an ACS calculating portion 13 for performing ACS processes in the Viterbi decoding process by using the values of the path metrics stored in the data memories 1 and 11 and the values of the branch metrics stored in the register file 20, and a bus 12 connected to the data memory 1 to transfer data.

Figure 11:
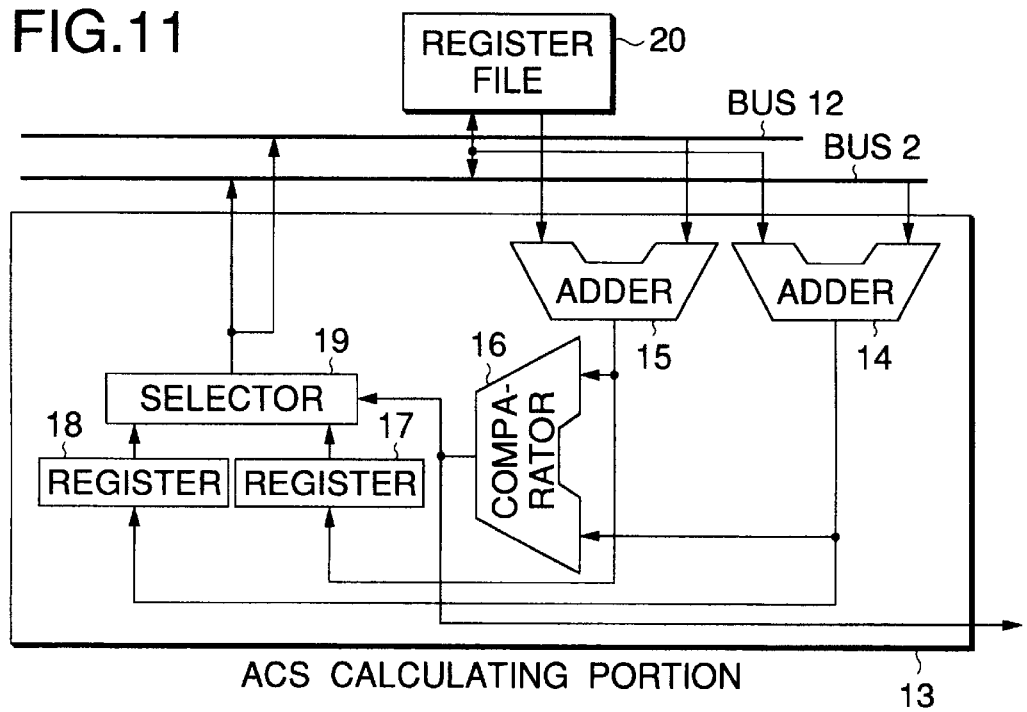
FIG. 11 is a block diagram showing the structure of an ACS calculating portion of an arithmetic apparatus according to third and fourth embodiments of the present invention.

The ACS calculating portion 13, as shown in FIG. 11, has adders 14 and 15 for adding the values of the path metrics output to the buses 2 and 12 and the value of the branch metric output from the register file 20 to one another, a comparator 16 for subjecting results of the additions respectively output from the adders 14 and 15 to a comparison to output one-bit control signal indicating a result of the comparison to the shift register 4 and a selector 19 to be described later, registers 17 and 18 for temporarily storing results of additions respectively output from the adders 14 and 15 and the selector 19 which follows the control signal output from the comparator 16 to select a smaller result of the results of the additions stored in the registers 17 and 18 to output the smaller value to the bus 2 or 12.

The operation of the unit according to this embodiment for performing the ACS processes will now be described.

Figure 17:
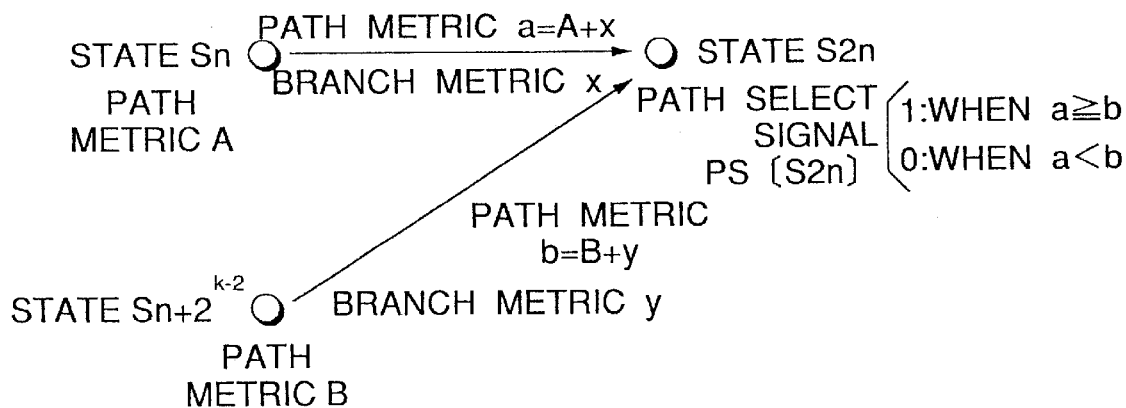
FIG. 17 is a state transition diagram (a trellis graph) showing the path of the state transition of convolutional coder for use in Viterbi decoding.
Figure 18:
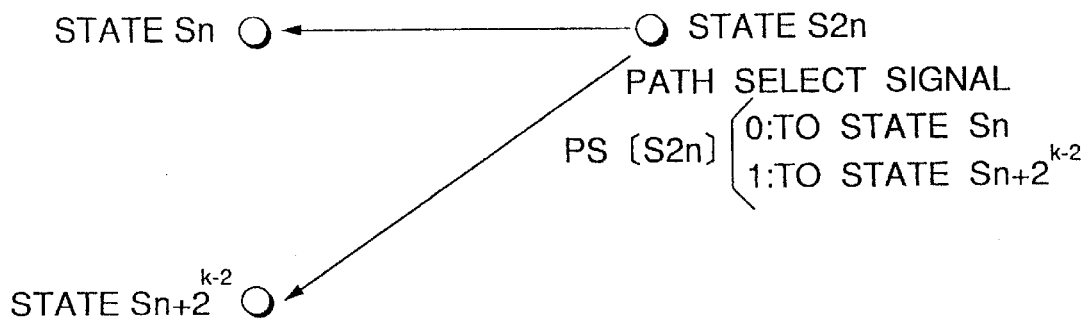
FIG. 18 is a state transition diagram (a trellis graph) showing an operation for tracing back the path when a tracing back operation for Viterbi decoding is performed.

The data memory 1 stores the values of path metrics including the value of path metric A shown in FIG. 17. The data memory 11 stores the values of path metrics including the value of path metric B shown in FIG. 17. The register file 20 stores the values of branch metrics including the values of branch metrics x and y.

The adder 14 of the ACS calculating portion 13 adds the value of path metric A read from the data memory 1 through the bus 2 and the value of branch metric x read from the register file 20 to each other to output a result of the addition to the comparator 16 and stores the same in the register 18. The adder 15 adds the value of the path metric B read from the data memory 11 through the bus 12 and the value of the branch metric y to each other to output a result of the addition to the comparator 16 and stores the same in the register 17.

The comparator 16 outputs, to the shift register 4 and the selector 19, a one-bit control signal which is made to be "0" when the result of the addition output from the adder 14 is smaller than the value output from the other adder 15 and which is made to be "1" when the result of the addition output from the adder 15 is smaller than the value output from the other adder 14.

The selector 19 selects the register 18 when the value of the control signal is "0" and selects the register 17 when the value of the control signal is "1" to store the value stored in each register into the data memory 1 or 11 through the bus 2 or 12.

The shift register 4 stores the control signal output from the comparator 16, that is, the path select signal while shifting the same by one bit.

The above-mentioned operation is performed for one ACS calculation.

In an example case where the constraint length K of the convolutional code, which must be decoded, is 6, the above-mentioned process is repeated by 32 times so that ACS calculations for one symbol of the received series can be performed. At this time, the selector 19 as it is stores the outputs thereof in the data memory 1 until 16 operations in the first stage are completed. The path select signals stored in the shift register 4 are stored in the data memory 1 through the bus 2. Sixteen next ACS calculations are performed such that the selector 19 stores the output thereof in the data memory 11 through the bus 12. The 16 bits of the path select signals in the latter portion stored in the comparator 16 are stored in the data memory 1 through the bus 2.

As a result, the path select signals are stored in the data memory 1, as shown in FIG. 3A. The above-mentioned ACS calculations for one symbol of the received series are repeated for n symbols of the received series.

Then, the tracing back process is performed in accordance with the procedure described in the first embodiment so that the Viterbi decoding process is performed.

As described above, the arithmetic apparatus according to this embodiment has the structure such that the shift register 4, by one bit, sequentially stores the path select signals output from the ACS calculating portion 13 when the ACS calculation is performed. Therefore, the ACS calculation can efficiently be performed as well as the tracing back process. Since the shift register 4 can be used commonly in the ACS calculation and the tracing back process, the area of an LSI chip can be reduced and thus the cost of a unit can be reduced if the arithmetic apparatus is realized by the LSI. Since the execution step can be reduced, the operation frequency can be lowered. Therefore, the electric power consumption of the overall arithmetic apparatus can be reduced.

Fourth Embodiment

An arithmetic apparatus according to a fourth embodiment is structured to perform an ACS calculation in Viterbi decoding to enable path select signals shown in FIG. 7A to be stored.

Figure 12:
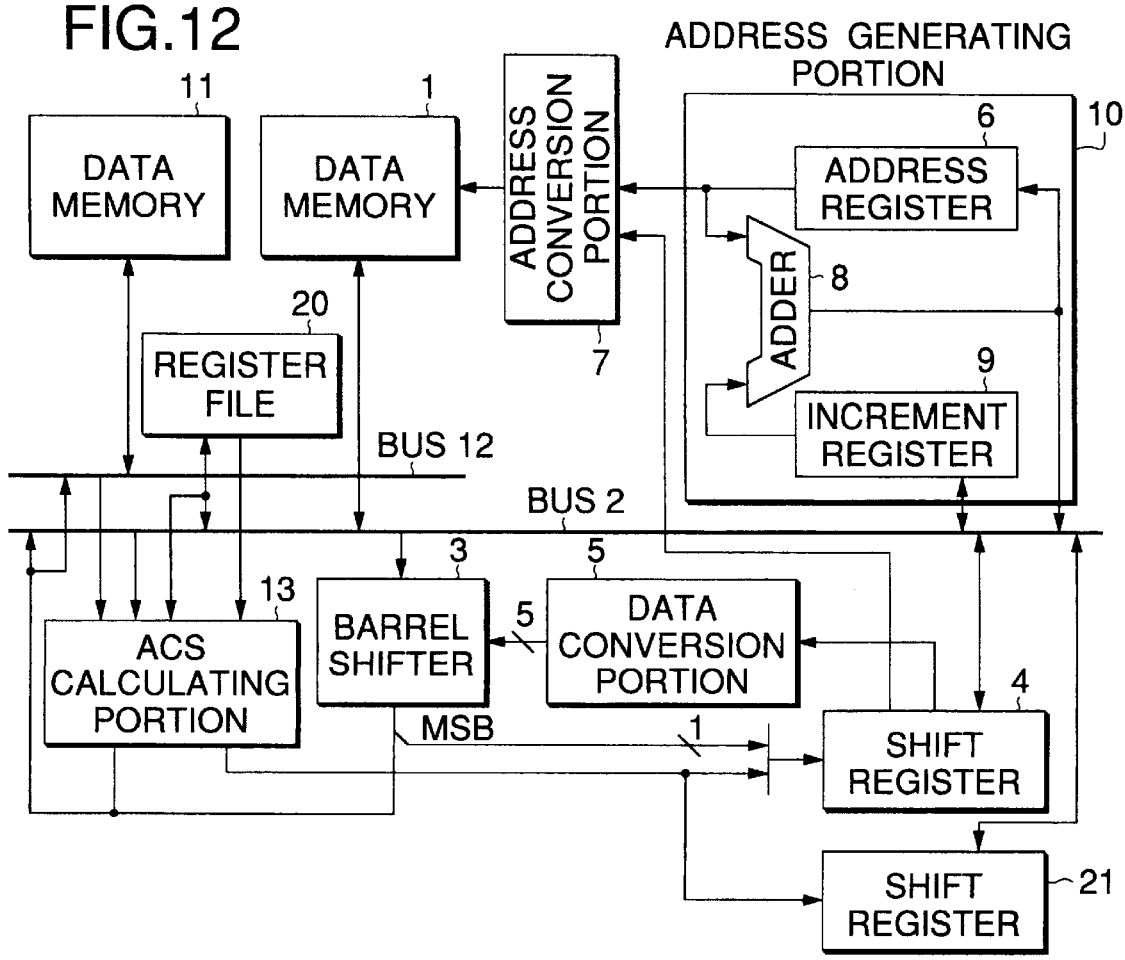
FIG. 12 is a block diagram showing the structure of the arithmetic apparatus according to a fourth embodiment of the present invention.
Figure 13:
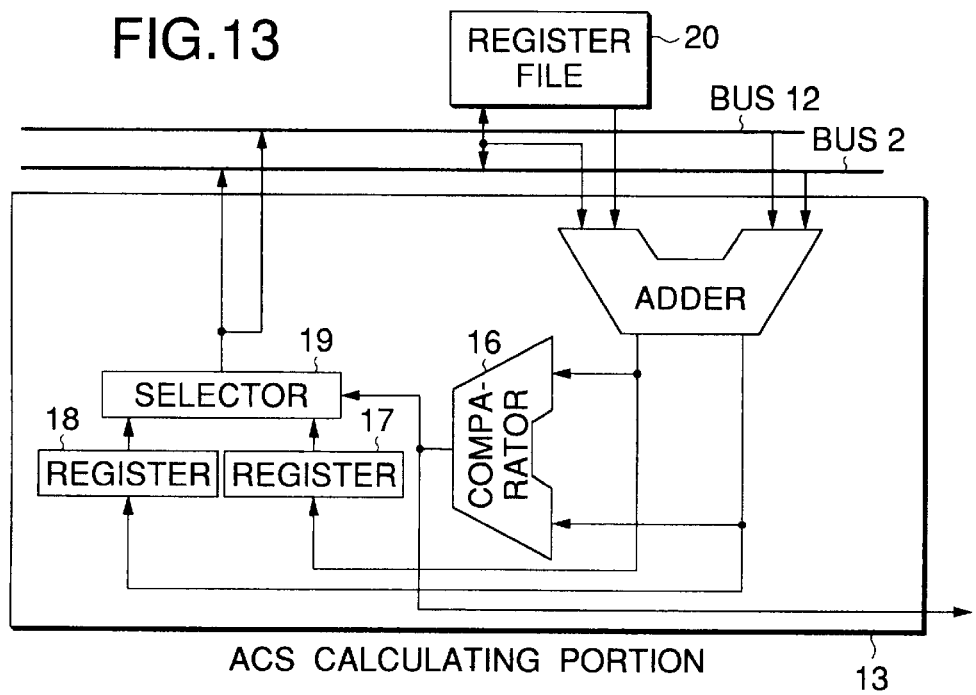
FIG. 13 is a block diagram showing the structure of an ACS calculating portion of an arithmetic apparatus according to a fifth embodiment of the present invention.

The unit according to this embodiment, as shown in FIG. 12, has a second shift register 21 for storing path select signals output from the ACS calculating portion 13. The other structures are the same as those according to the third embodiment (see FIG. 10).

The unit according to this embodiment performs the same operation as that of the unit according to the third embodiment except for a process for storing path select signals. The process for storing the path select signal is performed as follows.

In an example case where the constraint length of the convolutional code, which must be decoded, is 6, the operation of the ACS calculation described in the third embodiment is repeated by 32 times. At this time, the path select signals output from the ACS calculating portion 13 are alternately and by each one bit stored by the shift register 4 and the shift register 21. That is, the path select signals are stored in the shift register 4 when an even-number operation is performed. When an odd-number operation is performed, the path select signals are stored in the shift register 21. After the ACS calculation has been performed by 32 times, the path select signals finally stored in the shift register 4 and the shift register 21 are sequentially stored in the data memory 1 through the bus 2.

At this time, the path select signals are stored as shown in FIG. 7A. Therefore, the ACS calculation for one symbol of the received series is repeated for n symbols of the received series, and then the tracing back process is performed in accordance with the procedure described in the second embodiment so that the Viterbi decoding process is performed.

As described above, the arithmetic apparatus according to this embodiment is structured in such a way that the shift register 4 and the shift register 21 alternately and each one bit store the path select signals output from the ACS calculating portion 13 when the ACS calculation is performed. Therefore, the processor described in the second embodiment and having the pipeline structure is enabled to efficiently perform the ACS calculation process as well as the tracing back process.

Since the shift register 4 can be commonly used in the ACS calculation and the tracing back process, the area of an LSI chip can be reduced when the unit is formed by an LSI to reduce the cost. Since the execution step can be reduced, the operation frequency can be lowered. Thus, the electric power consumption of the overall arithmetic can be reduced.

Although the shift registers 4 and 21 are provided in this embodiment, the number of the shift registers may be increased. If four shift registers are provided for example, the ACS calculation is performed when the constraint length K of the convolutional code, which must be decoded, is 7 is performed such that each one bit of the path select signals is sequentially stored in the shift register; and the same is finally and sequentially stored in the data memory 1. In this case, the path select signals are stored, as shown in FIG. 7B.

Fifth Embodiment

An arithmetic apparatus according to a fifth embodiment is structured such that the adder of the ACS calculating portion according to the third or fourth embodiment is improved.

The unit according to this embodiment has a structure such that the ACS calculating portion 13 has an adder 22 having a width of 32 bits so that addition of four data items is performed such that the addition of the upper portion and that of the lower portion are simultaneously and in parallel performed. Therefore, the function for performing an operation similar to the operation which is performed by the structure shown in FIG. 11 can be realized. That is, the adder according to the present invention is able to serve as two 16-bit adders.

Figure 14:
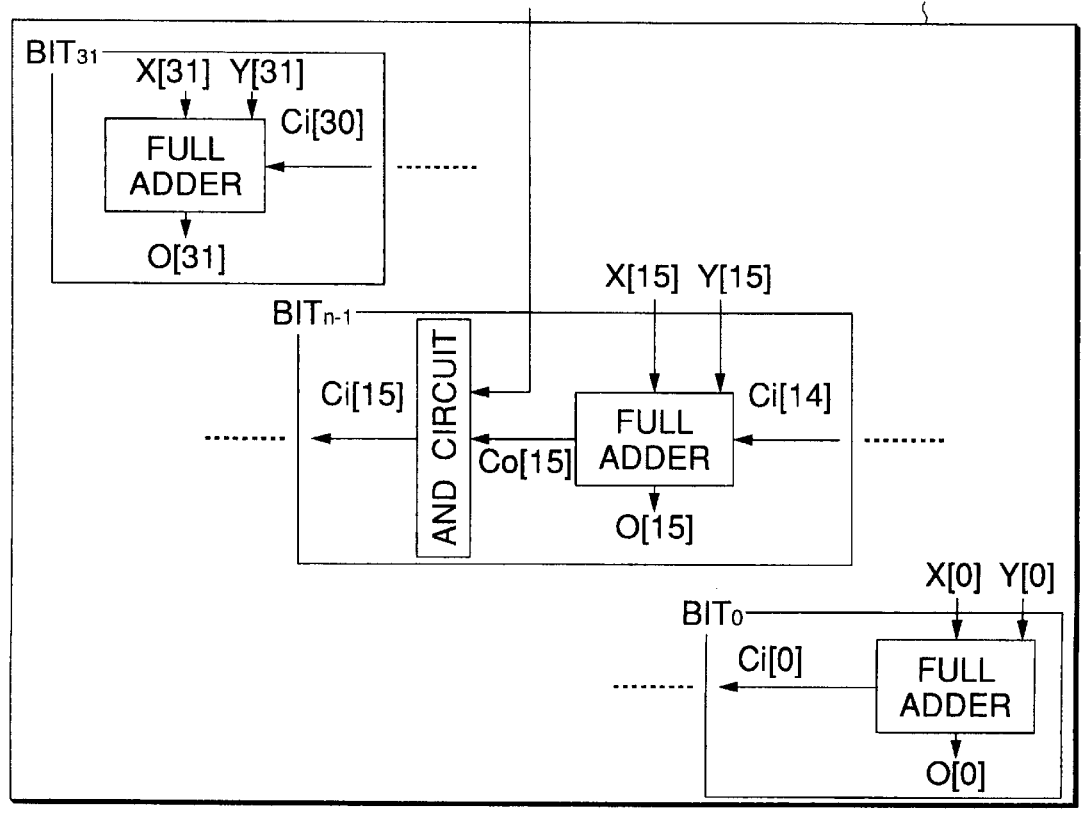
FIG. 14 is a block diagram showing the structure of an adder of the arithmetic apparatus according to the fifth embodiment.
Figure 15:
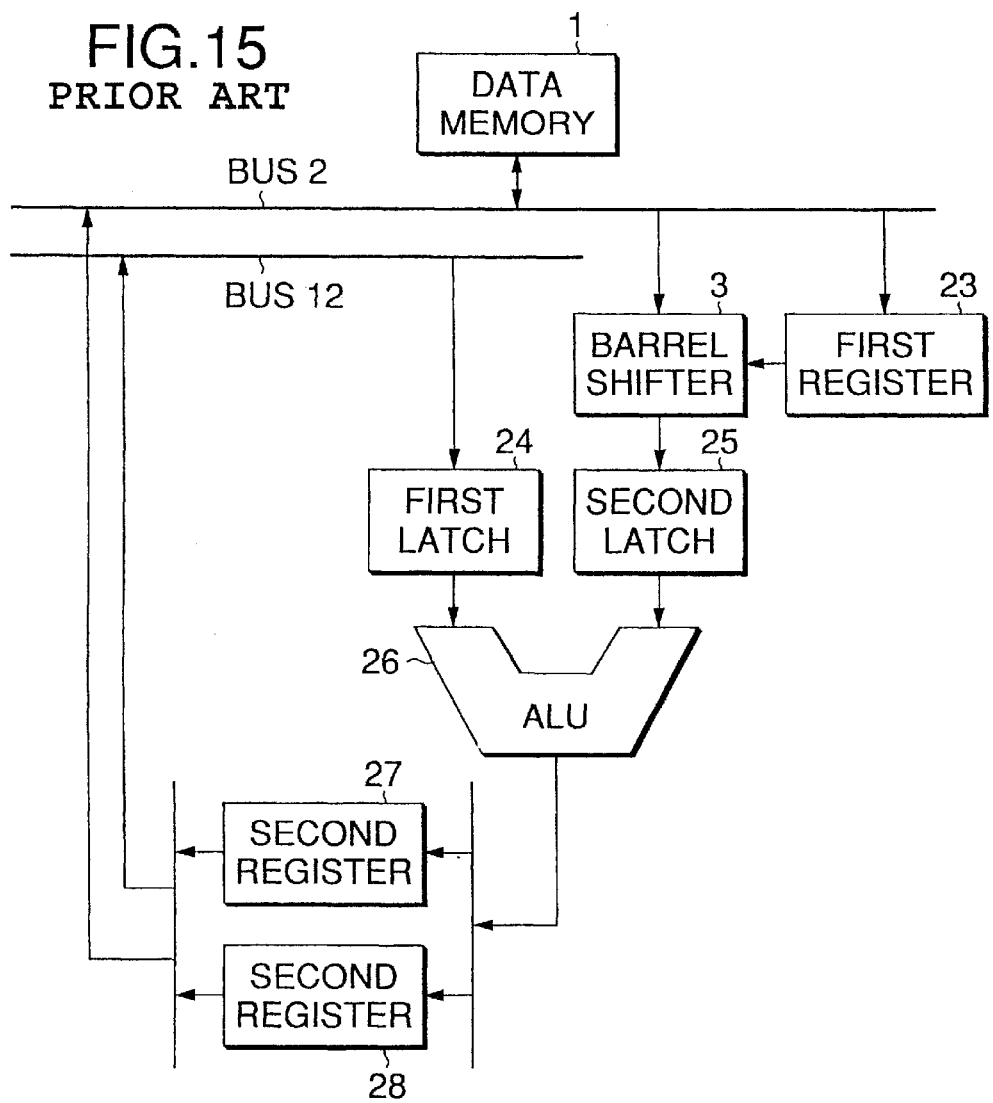
FIG. 15 is a block diagram showing the structure of a conventional arithmetic apparatus.
Figure 16:
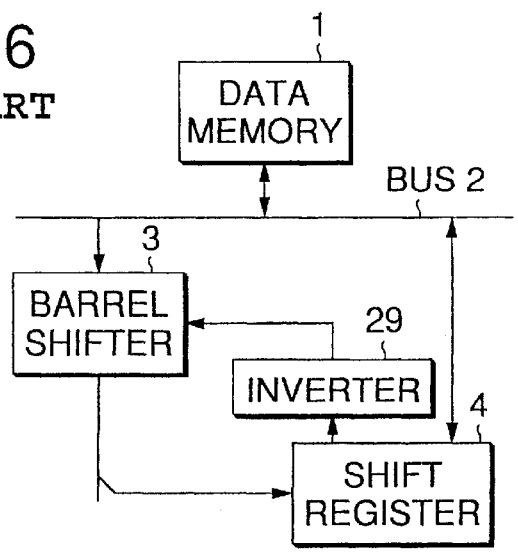
FIG. 16 is a block diagram showing the structure of another conventional arithmetic apparatus.

The adder 22 includes 32 full adders, as shown in FIG. 14. Each of the full adders performs addition of corresponding bits 0 to 31. The full adder for bit 0 adds input X[0] and input Y[0] to each other to output sum O[0] without carry and carry signal Ci[0], the full adder for bit 31 adds input X[31], input Y[31] and previous carry signal Ci[30] to one another to output sum O[31] without carry and each of the full adders for bit 1 to 30 adds input X, input Y and previous carry signal Ci to one another to output sum 0 without carry and carry signal Ci.

Only the carry signal Co[15] output from the full adder for bit 15 is supplied to an AND circuit so as to be output as carry signal Ci[15] to the next full adder for bit 16 through the AND circuit. The AND circuit also receives a control signal supplied from a control portion (not shown). Thus, the control signal inhibits transmission of the carry signal to a next adder.

In a viewpoint of the function, the full adders for bits 0 to 15 correspond to the adder 14 shown in FIG. 11. The full adders for 16 bits from bit 16 to bit 31 correspond to the adder 15 shown in FIG. 11.

When the ACS calculation is performed, the value of the control signal, which is supplied to the AND circuit, is made to be zero so that transmission of the carry signal output from the full adder for bit 15 is inhibited. In this state, Viterbi decoding can be performed by the same operation as that according to the third embodiment or the fourth embodiment.

When the control signal is made to be 1, the adder 22 acts as a usual 32-bit adder. In general, the DSP is provided with an adder having a bit width greater than 32 bits as an accumulator. The adder 22 may be employed as the accumulator.

As described above, the arithmetic apparatus according to this embodiment is able to efficiently perform the ACS calculating process as well as the tracing back process. Moreover, the mounted adder 22 can be used commonly to perform Viterbi decoding and the accumulation.

Therefore, when an arithmetic apparatus is formed by an LSI, the area of the LSI chip can be reduced and thus the cost of the unit can be reduced.

Sixth Embodiment

Figure 19:
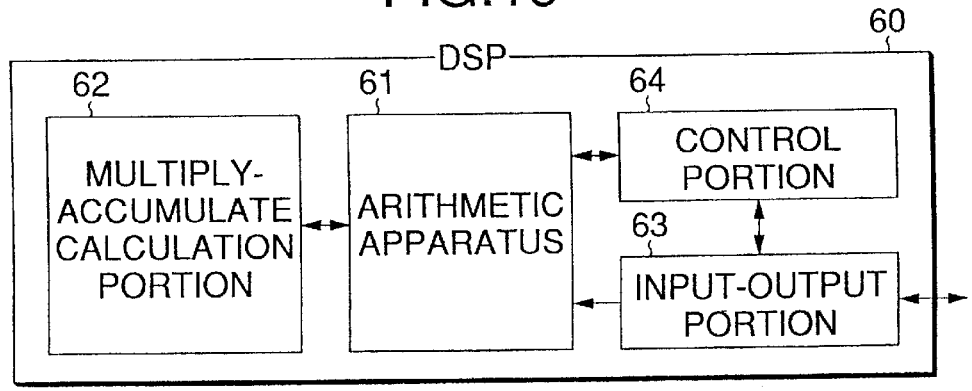
FIG. 19 is block diagram of a digital signal processor using the arithmetic apparatus according to the present invention.

FIG. 19 is a block diagram showing a digital signal processor (DSP) using the arithmetic apparatus according to one of the above-mentioned first to fifth embodiments. According to sixth embodiment, a DSP 60 comprises: an arithmetic apparatus 61 according to one of the first to fifth embodiment as previously described; a multiply-accumulate calculation portion 62 connected to the arithmetic apparatus 61; an input-output portion 63 connected to the arithmetic apparatus 61 to input and output data to and from external; and a control portion 64 for controlling the arithmetic apparatus 61, the multiply-accumulate calculation portion 62 and the input-output portion 63.

According to the sixth embodiment, the DSP is able to quickly and efficiently perform the tracing back process for Viterbi decoding without a necessity of enlarging the bit width of the data memory and the bus.

Seventh Embodiment

Figure 20:
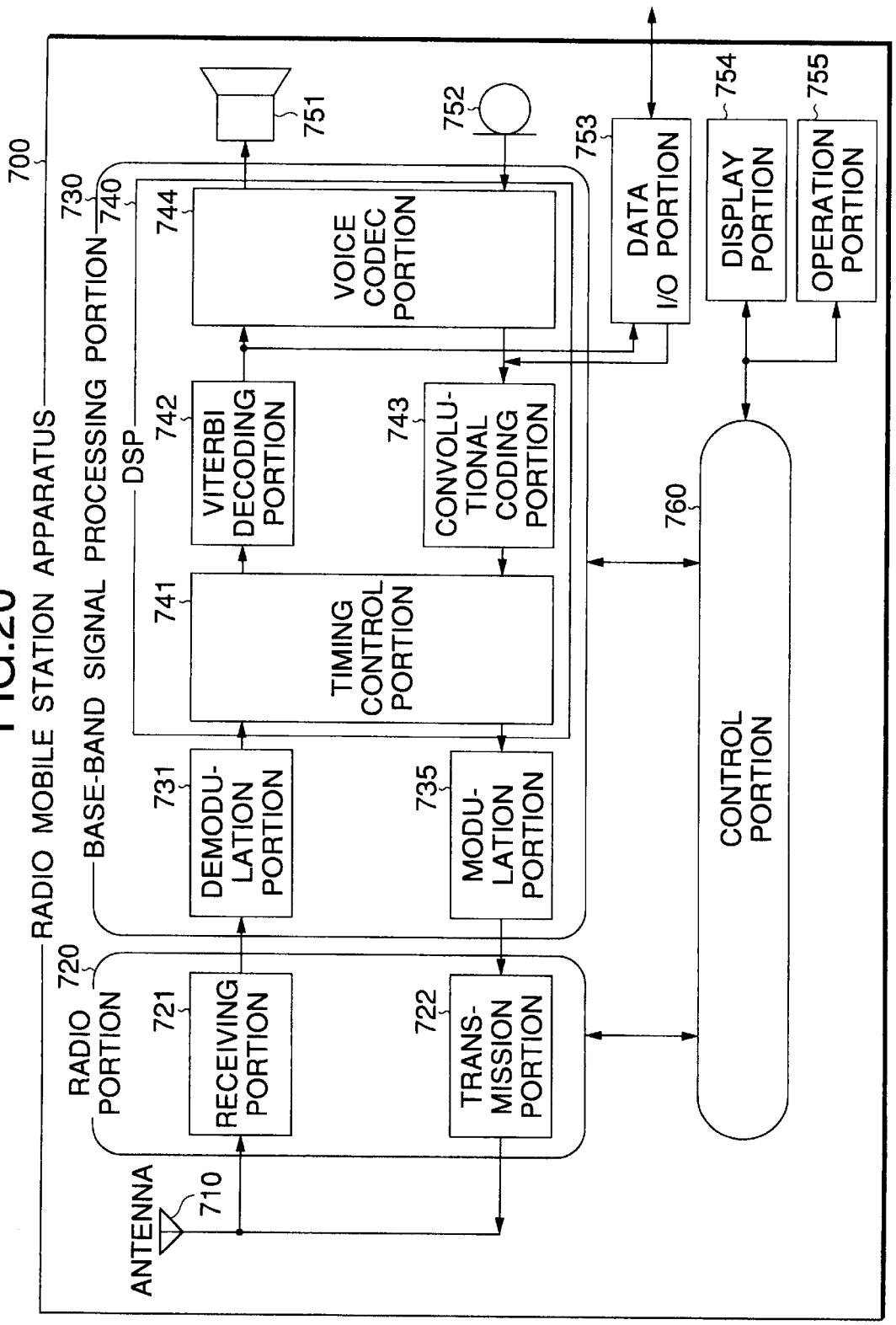
FIG. 20 is a block diagram of a radio mobile station apparatus according to the present invention.

FIG. 20 is a block diagram showing a radio mobile station apparatus using a digital signal processor (DSP) in that the arithmetic apparatus according to one of the above-mentioned first to fifth embodiments is incorporated.

In FIG. 20, a radio mobile station apparatus comprises: an antenna portion 710, a radio portion 720, a base-band signal processing portion 730 having a DSP 740 provided for encoding and decoding signals, a control portion 760, a speaker 751, a microphone 752, a data input-output portion 753, a display portion 754, and an operating portion 755. The radio portion 720 includes a receiving portion 721 which receives a reception signal from the antenna portion 710 and sends the reception signal to the base-band signal processing portion 730, and a transmitting portion 722 which receives a transmission signal from the base-band signal processing portion and sends the transmission signal to the antenna portion 710. The base-band signal processing portion 730 includes a demodulation portion 731 which demodulate the reception signal from the receiving portion 721, a modulation portion 735 which modulates the transmission signal, and the DSP 740 which performs the encoding and decoding. The DSP 740 is composed of a timing control portion 741, a Viterbi decoding portion 742, a convolutional encoding portion 743, and a voice codec portion 744.

The control portion 760 controls the antenna portion 710, the radio portion 720, the base-band signal processing portion 730, the display portion 754, the operation portion 755, and the like so that the control portion 760 controls the overall operation of the radio mobile station apparatus. For example, the control portion 760 controls such that the a signal input from the operation portion 760 is displayed on the display portion 754, and in response to the signal input from the operation portion, a control signal for performing a call transmission and receiving operation is output to the antenna portion 710, the radio portion 720, the base-band signal processing portion 730 and the like according to a communication sequence.

In the above-mentioned radio mobile station apparatus 700, at least a portion of the base-band signal processing portion is realized by the processing unit according to one of the first to fifth embodiment, or the DSP according to the sixth embodiment.

A transmission operation of the above-mentioned radio mobile station apparatus will be described hereinafter.

When voice communication is performed, a voice signal input from the microphone is subjected analog-to-digital conversion (not shown), and then encoded by a codec portion 744 of the DSP 740. The coded data is input to the convolutional coding portion 743. When data communication is performed, data input from external is input to the convolutional coding portion 743 through the data input-output portion 753.

The convolutional coding portion 743 convolutionally encodes the input data and output the encoded data.

The timing control portion 741 rearranges the input data and adjusts the transmission output timing to output result to the modulation portion 735.

The data which is digital-modulated in the modulation portion 735 is subjected digital-to-analog conversion. Then it is output to the transmitting portion 722 of the radio portion 720.

The transmitting portion 722 converts the signal into radio signal to transmit the signal to the antenna portion, so that the signal is radiated as electric waves.

Next, a receiving operation is described. Electric waves received by the antenna portion 710 are received by a receiving portion 721 of the radio portion 720, and subjected analog-to-digital conversion to output to the demodulation portion 731 of the base-band signal processing portion. The data demodulated by the demodulating portion 731 is rearranged and input to the viterbi decoding portion 742.

When the voice communication is performed, the data decoded by the viterbi decoding portion 742 is voice-decoded in the voice codec portion 744, and then digital-to-analog converted to be output as voice through the speaker 751. On the other hand, when data communication is performed, data is output to the external thorough the data input-output portion 753.

Figure 21:
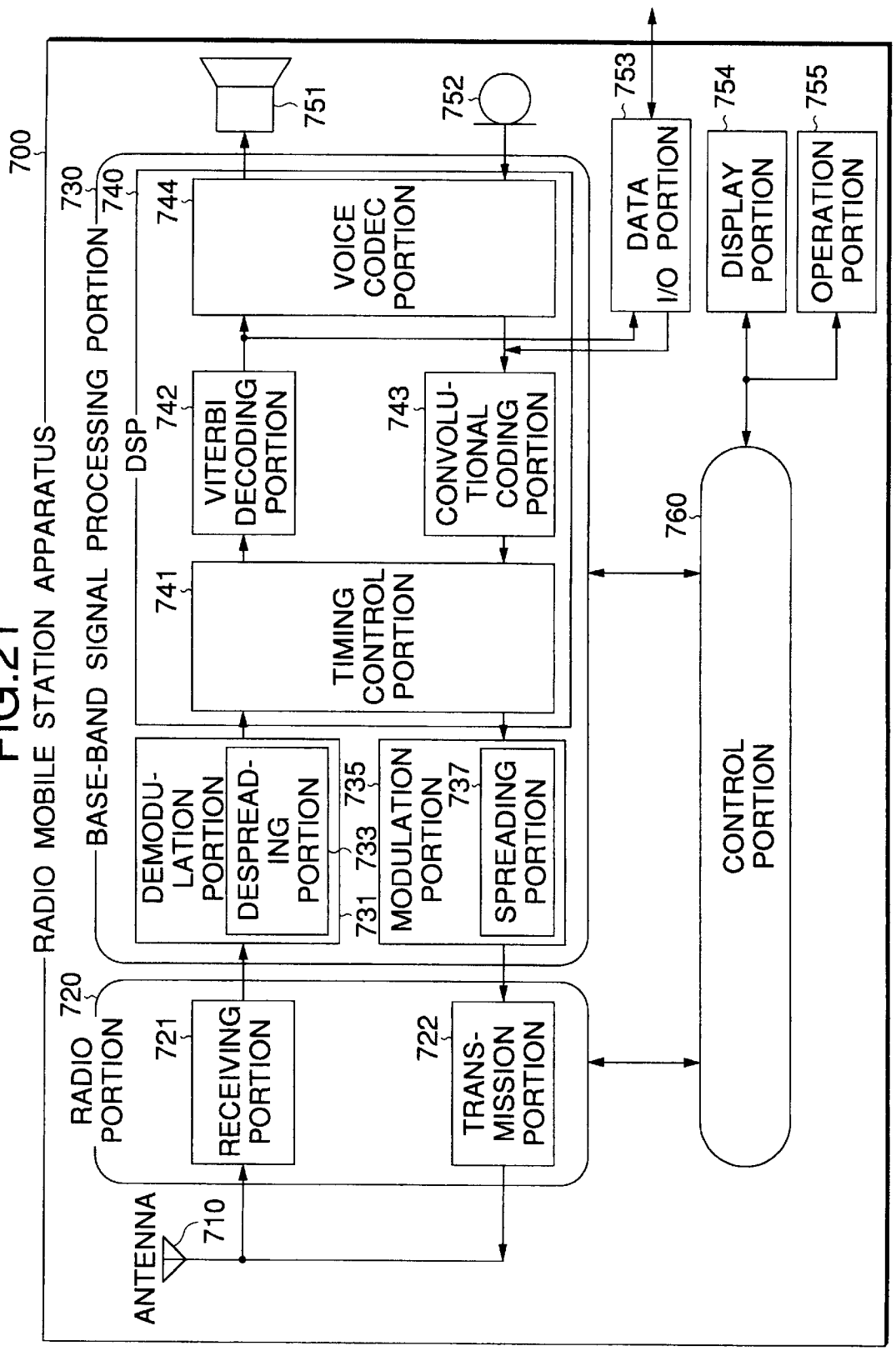
FIG. 21 is a block diagram of another radio mobile station apparatus according to the present invention.

FIG. 21 shows a modification of the radio mobile station apparatus according to the present invention. In this radio mobile station apparatus, a spreading portion 737 is provided in the modulation portion 735, and a despreading portion 733 is provided in the demodulation portion 731. Because of provision of the spreading portion 735 and the despreading portion 733, CDMA (code division multiple access) communication becomes enable.

Figure 22:
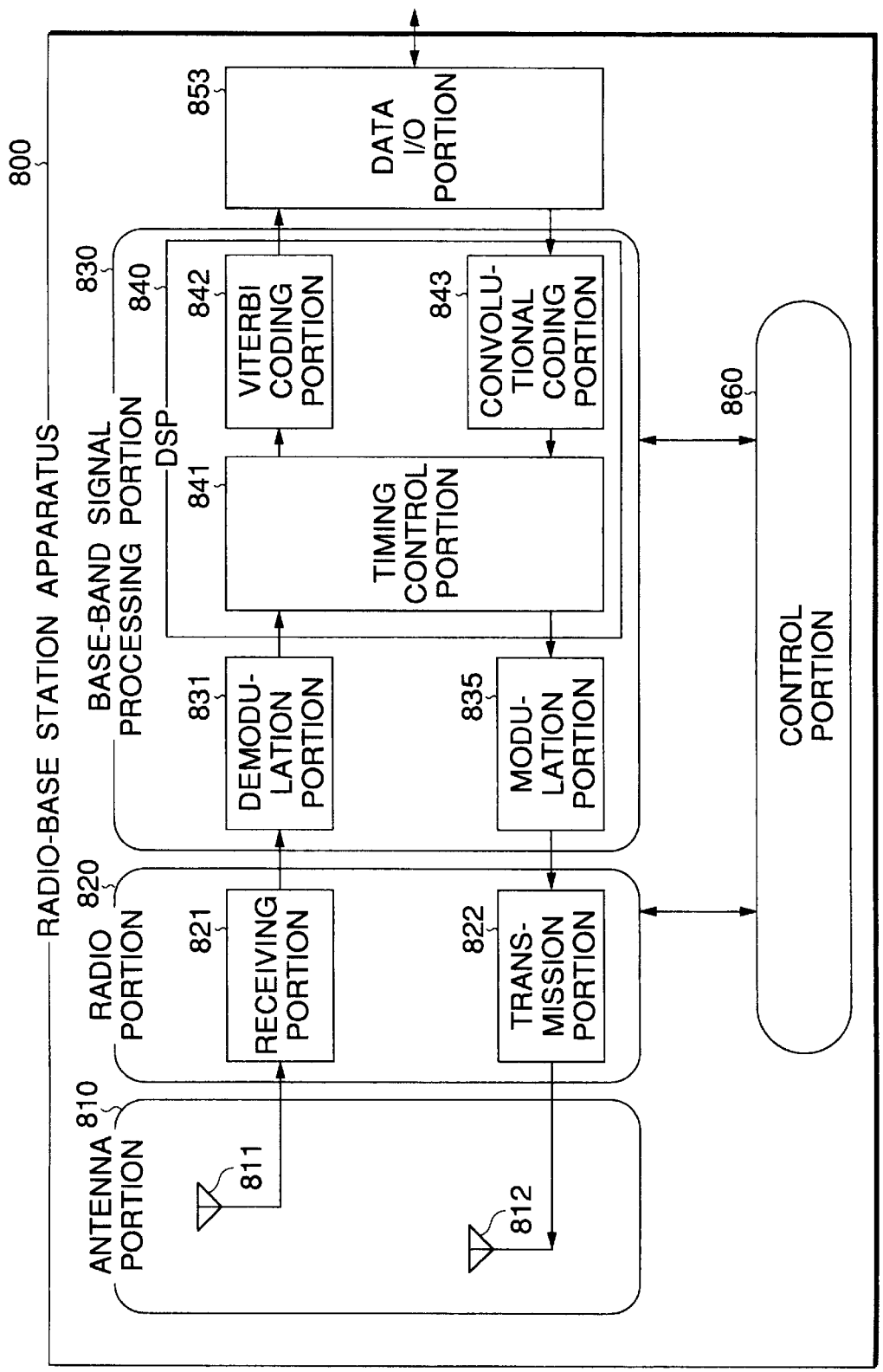
FIG. 22 is a block diagram of a radio base station apparatus according to the present invention.

FIG. 22 is a block diagram showing a radio base station apparatus using a digital signal processor (DSP) in that the arithmetic apparatus according to one of the above-mentioned first to fifth embodiments is incorporated.

The radio base station apparatus shown in FIG. 22 has a substantially same construction in that an antenna portion 810, a radio portion 820, a base-band signal processing portion 830 having a DSP 840 provided for encoding and decoding signals, a control portion 860, and a data input-output portion 853 are included.

The antenna portion 810 of the radio base station apparatus comprises a receiving antenna 811 only for receiving, and a transmission antenna 812 only for transmitting.

Figure 23:
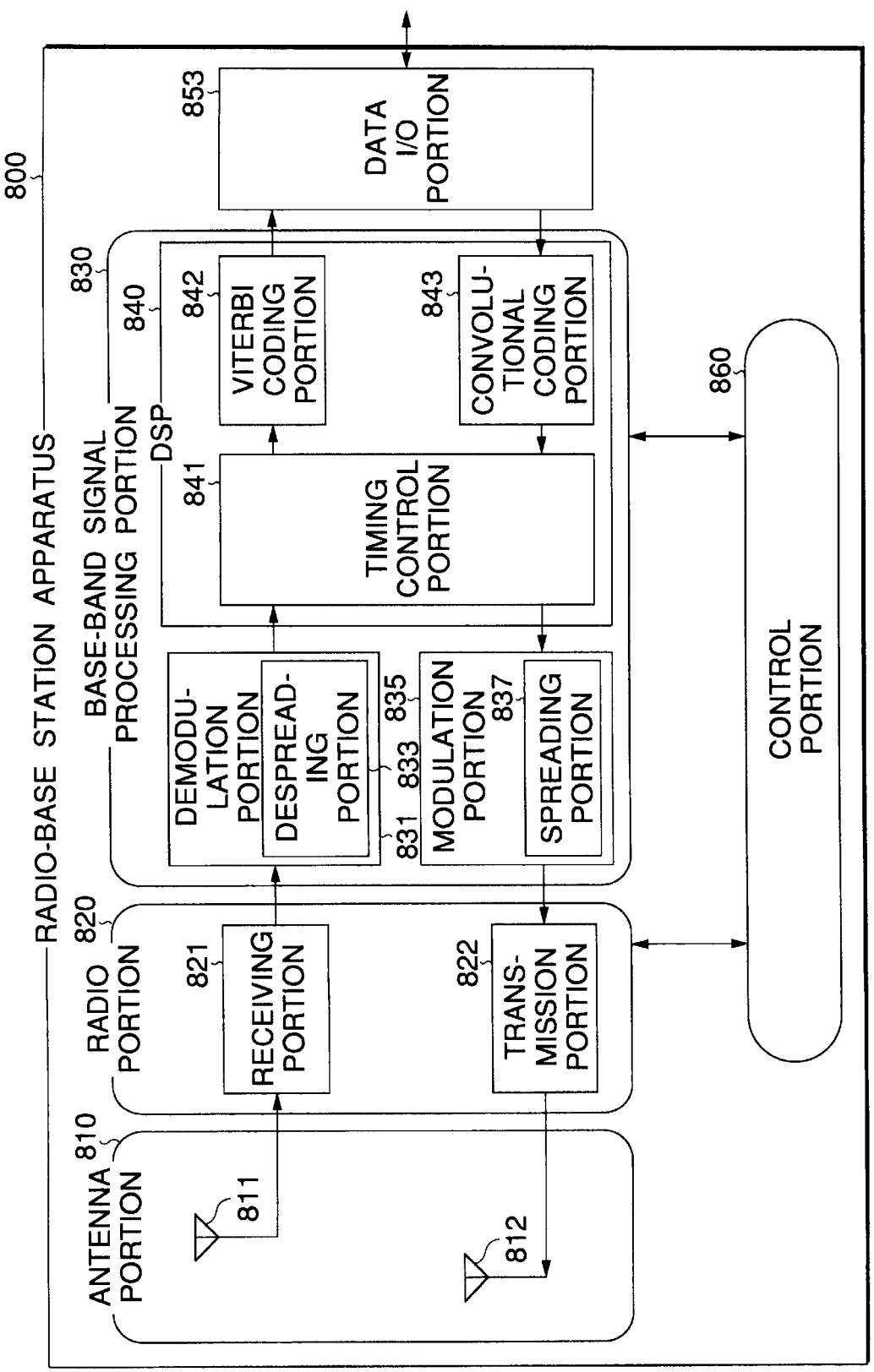
FIG. 23 is a block diagram of another radio base station apparatus according to the present invention.

FIG. 23 shows a modification of the radio base station apparatus according to the present invention. In this radio base station apparatus, a spreading portion 837 is provided in the modulation portion 835, and a despreading portion 833 is provided in the demodulation portion 831. Because of provision of the spreading portion 835 and the despreading portion 833, CDMA (code division multiple access) communication becomes enable.

As can be understood from the description above, the arithmetic apparatus according to the present invention is able to quickly and efficiently perform the tracing back process for Viterbi decoding without a necessity of enlarging the bit width of the data memory and the bus.

Moreover, a unit of a type for inputting a path select signal obtained by the ACS calculation to a shift register thereof is enabled to efficiently and an interlinked manner perform the ACS calculation and the tracing back process for Viterbi decoding while preventing enlargement of the circuit size.

The unit enabled to commonly use the adder for use in the ACS calculation in the accumulation is able to efficiently use the circuit.

The above-mentioned unit is able to reduce the area of the chip when an LSI is employed to form the unit. Thus, the reduction of the cost and the electric power consumption can be realized.

Furthermore, the above-mentioned arithmetic apparatus can be used to form a DSP. Moreover, if this DSP processor is used as a error correction circuit to form a radio mobile station apparatus or a radio base station apparatus, it is able to quickly and efficiently perform the tracing back process for Viterbi decoding in the signal processing of the communication.

What is claimed is:

1. An arithmetic apparatus comprising:
    a data memory for storing path select signals in a manner that path select signals at the same time are divided into a plurality of groups;
    a barrel shifter for shifting data read from said data memory;
    a shift register for receiving one bit shifted to a MSB by said barrel shifter;
    data conversion means for generating the number of shifts which are performed by said barrel shifter by converting data positioned at a specific bit position in said shift register so as to perform Viterbi decoding process for generating the number of shifts which are performed by said barrel shifter;
    address generating means for outputting the address in said data memory; and
    address conversion means for generating the address of said group, which is read from said data memory, in accordance with the address output from said address generating means and the value of a specific bit position in said shift register.

2. An arithmetic apparatus according to claim 1, wherein said path select signals are divided into a plurality of groups in order to cause suffixes respectively provided for said path select signals to be continued in said group, and said address conversion means uses the address output from said address generating means and the values of positions of a predetermined number of bits including a bit at an input end of said shift register to generate the address of said group.

3. An arithmetic apparatus according to claim 2, wherein said data conversion means inverts the values of the positions of a predetermined number of bits excluding a bit at an input end of said shift register to generate the number of shifts which are performed by said barrel shifter.

4. An arithmetic apparatus according to claim 1, wherein said path select signals are divided into a plurality of groups in order to cause suffixes respectively provided for said path select signal to maintain predetermined differences in said group, and said address conversion means uses the address output from said address generating means and the values of positions of a predetermined number of bits excluding a bit at an input end of said shift register to generate the address of said group.

5. An arithmetic apparatus according to claim 4, wherein said data conversion means inverts the values of the positions of a predetermined number of bits including a bit at an input end of said shift register to generate the number of shifts which are performed by said barrel shifter.

6. An arithmetic apparatus according to claim 4, wherein said address conversion means obtains, from a predetermined position of a bit in said shift register and at the time at which a group previous to said group is read from said data memory, the value required to generate the address of said group and supplied from said shift register.

7. An arithmetic apparatus according to claim 2, further comprising ACS processing means for performing addition, comparison and selection operations in the Viterbi decoding process, wherein path select signals output from said ACS processing means are sequentially stored in said shift register, and after the path select signal of said group has been stored in said shift register, said path select signal is in each group, shifted to be stored in said data memory.

8. An arithmetic apparatus according to claim 4, further comprising ACS processing means for performing addition, comparison and selection operations in the Viterbi decoding process, wherein path select signals output from said ACS processing means are sequentially stored in a plurality of shift registers including said shift register, and after the path select signal of said group has been stored in said shift register, said path select signal is in each group, shifted to be stored in said data memory.

9. An arithmetic apparatus according to claim 7, wherein said ACS processing means has addition means composed of a plurality of full adders and transmission of carry signals output from a portion of said full adders to a next full adder is permitted so that said addition means is permitted to be used as one or more accumulators.

10. An arithmetic apparatus according to claim 8, wherein said ACS processing means has addition means composed of a plurality of full adders and transmission of carry signals output from a portion of said full adders to a next full adder is permitted so that said addition means is permitted to be used as one or more accumulators.

11. A digital signal processor comprising:
    an arithmetic apparatus;
    a multiply-accumulate calculation portion connected to said arithmetic apparatus;
    an input-output portion connected to said arithmetic apparatus for inputting and outputting data to and from external; and
    a control portion for controlling said arithmetic apparatus, said multiply-accumulate calculation portion and said input-output portion;
    wherein said arithmetic apparatus comprises:
        a data memory for storing path select signals in a manner that path select signals at the same time are divided into a plurality of groups;
        a barrel shifter for shifting data read from said data memory;
        a shift register for receiving one bit shifted to a MSB by said barrel shifter;
        data conversion means for generating the number of shifts which are performed by said barrel shifter by converting data positioned at a specific bit position in said shift register so as to perform Viterbi decoding process for generating the number of shifts which are performed by said barrel shifter;

address generating means for outputting the address in said data memory; and address conversion means for generating the address of said group, which is read from said data memory, in accordance with the address output from said address generating means and the value of a specific bit position in said shift register.

12. A radio station apparatus comprising:

an antenna portion for receiving and transmitting a signal;

a radio portion including a receiving portion for receiving a receiving signal from said antenna portion, and a transmitting portion for transmitting a transmission signal to said antenna portion;

a base-band signal processing portion including a demodulation portion which demodulate the receiving signal from said receiving portion, a modulation portion which modulates the transmission signal, and a digital signal processor which performs the encoding and decoding;

a control portion for controls said antenna portion, said radio portion, said base-band signal processing portion; and an input-output portion for inputting and outputting the signals from and to an external;

wherein said base-band signal processing portion includes an arithmetic apparatus comprising:

a data memory for storing path select signals in a manner that path select signals at the same time are divided into a plurality of groups;

a barrel shifter for shifting data read from said data memory;

a shift register for receiving one bit shifted to a MSB by said barrel shifter;

data conversion means for generating the number of shifts which are performed by said barrel shifter by converting data positioned at a specific bit position in said shift register so as to perform Viterbi decoding process for generating the number of shifts which are performed by said barrel shifter;

address generating means for outputting the address in said data memory; and address conversion means for generating the address of said group, which is read from said data memory, in accordance with the address output from said address generating means and the value of a specific bit position in said shift register.

13. A radio station apparatus as claimed in claim 12, wherein said modulation portion has a spreading portion, and said demodulation portion has a despreading portion, and wherein said radio station performs CDMA (code division multiple access) communication.

14. A radio station apparatus as claimed in claim 12, wherein said signal input or output through said input-output portion is a voice signal, and said input-output portion includes a conversion means for converting the voice signal into a electric signal and converting the electric signal into the voice signal, and said radio station apparatus is a radio mobile station apparatus.

15. A radio station apparatus as claimed in claim 12, wherein said radio station apparatus is a radio base station apparatus.

\* \* \* \* \*

UNITED STATES PATENT AND TRADEMARK OFFICE
CERTIFICATE OF CORRECTION

PATENT NO. : 5,970,097
DATED : October 19, 1999
INVENTOR(S) : Ishikawa et al.

PAGE 1 OF 2

It is certified that error appears in the above-indentified patent and that said Letters Patent is hereby corrected as shown below:

On the Title Page, References Cited, after FOREIGN PATENT DOCUMENTS, add --OTHER REFERENCES, XP 000071846--.

Column 2, Line 18, delete "[i=0 to $2_{K-1}$]" and insert --[i=0 to $2^{K-1}$]--.

Column 2, Line 42, delete "comprise" and insert --comprises--.

Column 3, Line 10, delete "date" and insert --data--.

Column 3, Line 62, delete "2" and insert --2,--.

Column 5, Line 20, delete "fromn" and insert --from--.

Column 5, Line 27, delete "pat" and insert --path--.

Column 5, Line 39, delete "date" and insert --data--.

UNITED STATES PATENT AND TRADEMARK OFFICE
CERTIFICATE OF CORRECTION

PATENT NO. : 5,970,097
DATED : October 19, 1999
INVENTOR(S) : Ishikawa et al.

It is certified that error appears in the above-indentified patent and that said Letters Patent is hereby corrected as shown below:

Column 7, Line 6, delete "s election" and insert --selection--.

Column 7, Line 15, delete "comprise" and insert --comprises--.

Column 11, Line 13, delete "$\{n+(n/2^{K-}1+3\}$" and insert --$\{n+(/2^{K-1})+3\}$--.

Signed and Sealed this

Third Day of April, 2001

Attest:

NICHOLAS P. GODICI

Attesting Officer

Acting Director of the United States Patent and Trademark Office